(12) United States Patent
Lim et al.

(10) Patent No.: US 11,621,312 B2
(45) Date of Patent: Apr. 4, 2023

(54) DISPLAY DEVICE

(71) Applicant: Samsung Display Co., LTD., Yongin-si (KR)

(72) Inventors: Sang Hyung Lim, Cheonan-si (KR); Jee Hoon Kim, Cheonan-si (KR); Mi Hyang Sheen, Asan-si (KR); Jin Ho Jang, Cheonan-si (KR); Myeong Kyu Park, Suwon-si (KR); Na Ri Ahn, Seongnam-si (KR); Hui Won Yang, Seoul (KR); Doo Hyoung Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 269 days.

(21) Appl. No.: 17/089,246

(22) Filed: Nov. 4, 2020

(65) Prior Publication Data

US 2021/0296422 A1 Sep. 23, 2021

(30) Foreign Application Priority Data

Mar. 20, 2020 (KR) .................. 10-2020-0034320

(51) Int. Cl.
*H01L 27/32* (2006.01)
*H01L 51/52* (2006.01)

(52) U.S. Cl.
CPC ........ *H01L 27/3276* (2013.01); *H01L 27/322* (2013.01); *H01L 27/3223* (2013.01); *H01L 27/3272* (2013.01); *H01L 51/5284* (2013.01); *H01L 2251/5315* (2013.01)

(58) Field of Classification Search
CPC ............ H01L 27/3276; H01L 27/3272; H01L 27/3288; H01L 27/3223
See application file for complete search history.

(56) References Cited

U.S. PATENT DOCUMENTS

| | | | |
|---|---|---|---|
| 2015/0293412 A1* | 10/2015 | Chiu ................... | H01L 27/1214 349/122 |
| 2017/0256620 A1* | 9/2017 | Lin ..................... | H01L 27/1214 |
| 2018/0053718 A1* | 2/2018 | Cheng ................. | H01L 27/1262 |

FOREIGN PATENT DOCUMENTS

| | | |
|---|---|---|
| JP | 4-104226 | 4/1992 |
| KR | 1997-0053546 | 7/1997 |
| KR | 2003-0057968 | 7/2003 |
| KR | 10-2004-0040241 | 5/2004 |
| KR | 10-2005-0062692 | 6/2005 |

* cited by examiner

*Primary Examiner* — Kevin M Nguyen
(74) *Attorney, Agent, or Firm* — Kile Park Reed & Houtteman PLLC

(57) ABSTRACT

A display device includes a first conductive pattern on a substrate, a first insulating layer on the first conductive pattern, a semiconductor pattern on the first insulating layer, a second insulating layer on the first insulating layer and the semiconductor pattern, and a second conductive pattern on the second insulating layer. A first edge of the first conductive pattern faces a second edge of the second conductive pattern, the first conductive pattern does not overlap the second conductive pattern in an area where the first edge faces the second edge, the semiconductor pattern is in the area where the first edge faces the second edge, the second conductive pattern overlaps the second insulating layer, and the second insulating layer includes a third edge protruding from the second edge of the second conductive pattern.

20 Claims, 17 Drawing Sheets

110: 111, 112, 113, 114
SC: ACT1, ACT2, ACT3, ACT4, ACT5, ACT6, ACT7, ACT8, ACT9, EST
EST: EST1, EST2, EST3
120: 121, 122, 123, 124, 125, 126, 127
130: 131, 132, 133, 134, 135, 136, 137, 138, 139
CE: CE1, CE2, CE3, CE4, CE5
140: 141, 142, 143
PXE: PXE1, PXE2, PXE3
OPH: OPH1, OPH2, OPH3
PX: PX1, PX2, PX3

110: 111, 112, 113, 114
SC: ACT1, ACT2, ACT3, ACT4, ACT5, ACT6, ACT7, ACT8, ACT9, EST
EST_4: EST1, EST2, EST3.EST4
120: 121, 122, 123, 124, 125, 126, 127
130: 131, 132, 133, 134, 135, 136, 137, 138, 139
CE: CE1, CE2, CE3, CE4, CE5
140: 141, 142, 143
PXE: PXE1, PXE2, PXE3
OPH: OPH1, OPH2, OPH3
PX: PX1, PX2, PX3

DISPLAY DEVICE

CROSS REFERENCE TO RELATED APPLICATION(S)

This application claims priority to and benefits of Korean Patent Application No. 10-2020-0034320 under 35 U.S.C. § 119 filed on Mar. 20, 2020 in the Korean Intellectual Property Office, the entire contents of which are incorporated herein by reference.

BACKGROUND

1. Technical Field

The disclosure relates to a display device.

2. Description of the Related Art

A display device for displaying an image may be used for various electronic appliances for providing an image to a user, such as smart phones, tablet PCs, digital cameras, notebook computers, navigators, and televisions.

A display device for displaying an image may include a display panel such as an organic light emitting display panel or a liquid crystal display panel. Among these display panels, a light emitting display panel may include a light emitting element such as a light emitting diode (LED), and the light emitting diode (LED) may include an organic light emitting diode (OLED) using an organic material as a fluorescent material and an inorganic light emitting diode using an inorganic material as a fluorescent material.

Such a display device may include a display panel, a gate driving circuit, a data driving circuit, and a timing controller. The display panel may include data lines, gate lines, and pixels formed or disposed at intersections of the data lines and the gate lines. Each of the pixels may receive a data voltage from a data line by using a thin film transistor as a switching element in a case that a gate signal is supplied to the gate line. Each of the pixels may emit light with a predetermined brightness according to the data voltages.

Recently, a display device capable of displaying an image with a high resolution of UHD (Ultra High Definition) has been commercially available. In the case of a high-resolution display device, as the number of pixels increases, a distance between gate lines and a distance between data lines decrease.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the of the disclosure provide a display device capable of suppressing or preventing a disconnection of a signal line and suppressing or preventing a short between adjacent signal lines.

However, aspects of the disclosure are not restricted to the ones set forth herein. The above and other aspects of the disclosure will become more apparent to one of ordinary skill in the art to which the disclosure pertains by referencing the detailed description of the disclosure given below.

An embodiment of a display device may include a first conductive pattern disposed on a substrate; a first insulating layer disposed on the first conductive pattern; a semiconductor pattern disposed on the first insulating layer; a second insulating layer disposed on the first insulating layer and the semiconductor pattern; and a second conductive pattern disposed on the second insulating layer, wherein a first edge of the first conductive pattern may face a second edge of the second conductive pattern, the first conductive pattern may not overlap the second conductive pattern in an area where the first edge of the first conductive pattern faces the second edge of the second conductive pattern, the semiconductor pattern may be disposed in the area where the first edge of the first conductive pattern faces the second edge of the second conductive pattern, the second conductive pattern may overlap the second insulating layer, and the second insulating layer may include a third edge protruding from the second edge of the second conductive pattern.

The semiconductor pattern may be a dummy semiconductor pattern insulated from a signal line or an electrode.

The semiconductor pattern may include an oxide semiconductor.

The semiconductor pattern may overlap the third edge of the second insulating layer in a thickness direction.

The second conductive pattern may extend in a first direction, and a width of the semiconductor pattern in a second direction intersecting the first direction may be smaller than a width of the second conductive pattern in the second direction.

The semiconductor pattern may overlap the first edge of the first conductive pattern and the second edge of the second conductive pattern in the thickness direction, and may overlap the first conductive pattern and the second conductive pattern.

The display device may further include a third insulating layer disposed on the second conductive pattern; and a third conductive pattern disposed on the third insulating layer, wherein the semiconductor pattern may overlap the third conductive pattern.

The third conductive pattern may extend in a first direction, and a width of the third conductive pattern in a second direction intersecting the first direction may be smaller than a width of the semiconductor pattern in the second direction.

The first conductive pattern and the second conductive pattern may extend in the second direction, a first power supply voltage may be applied to the first conductive pattern, the second conductive pattern may transmit at least one of a scan signal and a sensing signal, and the third conductive pattern may transmit a data signal.

A thickness of the first insulating layer in an area where the first insulating layer does not overlap the semiconductor pattern may be smaller than a thickness of the first insulating layer in an area where the first insulating layer overlaps the semiconductor pattern.

An embodiment of a display device may include a first conductive layer disposed on a substrate and including a lower light blocking pattern overlapping an active layer of a transistor; and a first conductive pattern separated from the lower light blocking pattern; a first insulating layer disposed on the first conductive layer; a semiconductor layer disposed on the first insulating layer and including the active layer and a semiconductor pattern insulated from the active layer; a second insulating layer disposed on the semiconductor layer, and a second conductive layer disposed on the second insulating layer and including a gate conductive pattern overlapping the active layer; and a second conductive pattern disposed on the semiconductor pattern, wherein the semiconductor pattern may overlap the first conductive pattern and the second conductive pattern, the second conductive layer may overlap the second insulating layer, and the second insulating layer may include a part that may overlap the second conductive layer, and another part that may protrude from the second conductive layer.

The semiconductor pattern may be a dummy semiconductor pattern insulated from a signal line or an electrode.

The semiconductor pattern may include an oxide semiconductor.

A thickness of the first insulating layer in an area where the first insulating layer does not overlap the semiconductor pattern may be smaller than a thickness of the first insulating layer in an area where the first insulating layer overlaps the semiconductor pattern.

A first edge of the first conductive pattern may face a second edge of the second conductive pattern, the first conductive pattern may not overlap the second conductive pattern in an area where the first edge of the first conductive pattern faces the second edge of the second conductive pattern, the semiconductor pattern may be disposed in the area where the first edge of the first conductive pattern faces the second edge of the second conductive pattern, and the second insulating layer may include a third edge protruding from the second edge of the second conductive pattern.

The semiconductor pattern may overlap the third edge of the second insulating layer in a thickness direction.

The semiconductor pattern may overlap the first edge of the first conductive pattern and the second edge of the second conductive pattern in a thickness direction, and may overlap the first conductive pattern and the second conductive pattern.

The display device may further include a third insulating layer disposed on the second conductive layer; and a third conductive pattern disposed on the third insulating layer, wherein the semiconductor pattern may overlap the third conductive pattern.

The third conductive pattern may extend in a first direction, and a width of the third conductive pattern in a second direction intersecting the first direction may be smaller than a width of the semiconductor pattern in the second direction.

The first conductive pattern and the second conductive pattern may extend in the second direction, a first power supply voltage may be applied to the first conductive pattern, the second conductive pattern may transmit at least one of a scan signal and a sensing signal, and the third conductive pattern may transmit a data signal.

According to embodiments, there may be provided a display device capable of suppressing or preventing a disconnection of a signal line and suppressing or preventing a short between adjacent signal lines.

The effects of the disclosure are not limited by the foregoing, and other various effects are anticipated herein.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
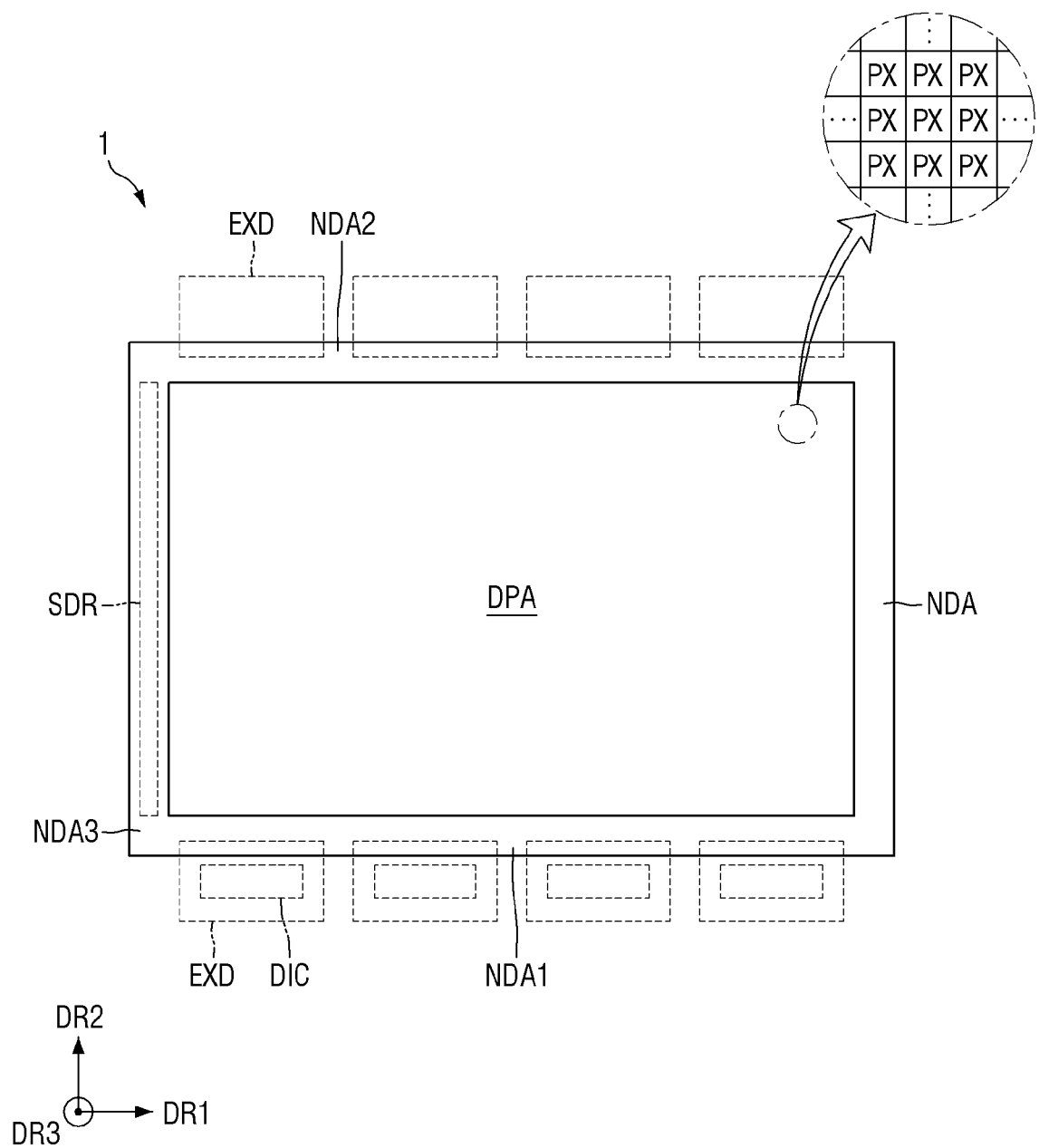
FIG. 1 is a plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to designate the same or similar elements throughout the drawings, and repetitive explanation will be omitted.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The singular forms "a," "an," and "the" as used herein are intended to include the plural forms as well unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Furthermore, when a first component or part is disposed on a second component or part, the first component or part may be not only directly on the second component or part but a third component or part may intervene between them. Furthermore, the term "position", "direction", etc. used in the following description are defined in relative terms, and it should be noted that they may be changed into a reverse position or direction depending on a view angle or direction.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" to another layer, region, or component, it may be "directly electrically connected" to the other layer, region, or component and/or may be "indirectly electrically connected" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

As used herein, the term "unit" or "module" denotes a structure or element as illustrated in the drawings and as described in the specification. However, the disclosure is not limited thereto. The term "unit" or "module" is not to be limited to that which is illustrated in the drawings.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to the attached drawings.

FIG. 1 is a plan view of a display device according to an embodiment.

A display device 1 may refer to any electronic device that provides a display screen. For example, the display device 1 may be applied to televisions, notebook computer, monitors, billboards, mobile phones, smart phones, tablet personal computers (PCs), electronic clocks, smart watches, watch phones, mobile communication terminals, electronic notebooks, e-books, portable multimedia players (PMPs), navigators, game machines, digital cameras, and internet of things (IoTs), each providing a display screen.

The display device 1 illustrated in the drawing is a television. The display device 1 is not limited thereto, but may have high resolution to ultra-high resolution such as HD, UHD, 4K, and 8K.

The display device 1 according to embodiments may be variously classified according to a display method. For example, display devices may be classified into an organic light emitting display (OLED), an inorganic light emitting display (inorganic EL), a quantum dot light emitting display (QED), a LED display (LED)), a plasma display (PDP), a field emission display (FED), a cathode ray display (CRT), a liquid crystal display (LCD), and an electrophoretic display (EPD). Hereinafter, as a display device, an organic light emitting display device will be described as an example, and the organic light emitting display device applied to an embodiment will be simply abbreviated as a display device 1, unless special classification is required. However, an embodiment is not limited to an organic light emitting display device, and other display devices listed above or known in the art may be applied within the scope of sharing a technical idea.

In the drawings, the first direction DR1 indicates a horizontal direction of the display device 1 in a plan view, and the second direction DR2 indicates a vertical direction of the display device 1 in a plan view. The third direction DR3 indicates a thickness direction of the display device 1. The first direction DR1 and the second direction DR2 intersect each other in a direction perpendicular to each other, and the third direction DR3 intersects both the first direction DR1 and the second direction DR2 in a direction intersecting the plane in which the first direction DR1 and the second direction DR2 lie. However, the directions mentioned in embodiments should be understood as mentioning relative directions, and the embodiments are not limited to the mentioned directions.

Unless otherwise defined, as used herein, "upper portion", "upper surface", and "upper side" expressed based on the third direction DR3 mean a side of a display surface based on the display panel 10, and "lower portion", "lower surface", and "lower side" expressed based on the third direction DR3 mean an opposite side of a display surface based on the display panel 10.

The display device 1 may have a substantially rectangular shape in a plan view (that is, when seen in a plan view). In a case that the display device 1 is a television, long sides may be located or disposed in the horizontal direction. However, the disclosure is not limited thereto, and the long sides may be located or disposed in the vertical direction, and the long sides may also be variably located or disposed in the horizontal or vertical direction by being rotatable.

The display device 1 may include a display area DPA and a non-display area NDA. The display area DPA may be an active area in which an image is displayed. The display area DPA may have a substantially rectangular shape in a plan view, similarly to the overall shape of the display device 1.

The display area DPA may include pixels PX. The pixels PX may be arranged or disposed in a matrix direction. The shape of each pixel PX may be substantially rectangular or square in a plan view, but is not limited thereto, and may be a rhombus shape in which each side may be inclined with respect to a direction of one or a side of the display device 1. Each of the pixels PX may include a first sub-pixel PX1, a second sub-pixel PX2, and a third sub-pixel PX3.

The non-display area NDA may be disposed around the display area DPA. The non-display area NDA may entirely or partially surround the display area DPA. The display area DPA may have a substantially rectangular shape, and the non-display area NDA may be disposed adjacent to or may surround four sides of the display area DPA. The non-display area NDA may constitute a bezel of the display device 1.

A driving circuit or driving element for driving the display area DPA may be disposed in the non-display area NDA. In an embodiment, in the first non-display area NDA1 adjacent to the first long side (lower side in FIG. 1) of the display device 1 and the second non-display NDA2 adjacent to the second long side (upper side in FIG. 1) of the display device 1, a pad unit may be provided or disposed on a display panel of the display device 1, and an external device EXD may be mounted on a pad electrode of the pad unit. Examples of the external device EXD include a connection film, a printed circuit board, a driving chip (DIC), a connector, and a wiring connection film. In the third non-display area NDA disposed adjacent to the first short side (left side in FIG. 1) of the display device 1, a scan driver SDR or the like directly formed on the display panel of the display device 1 may be disposed.

Figure 2:
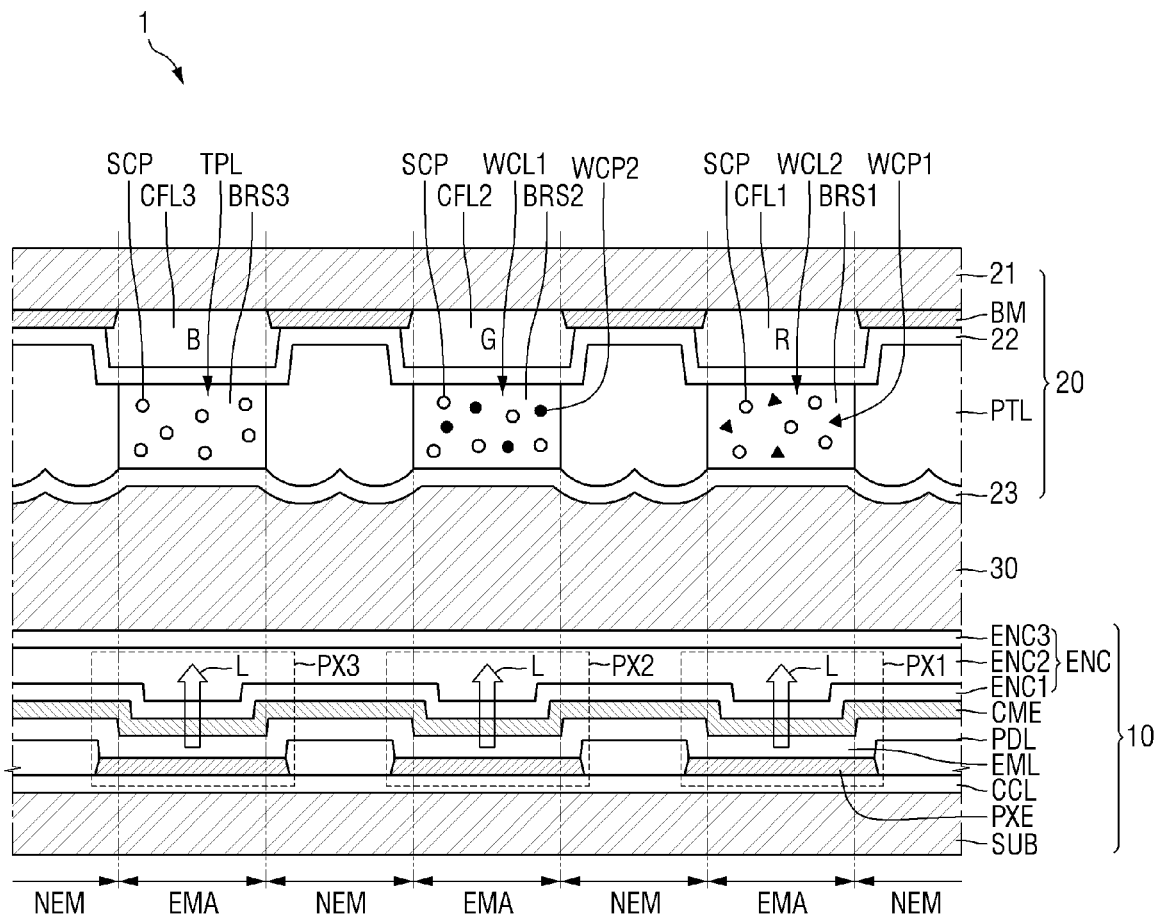
FIG. 2 is a schematic cross-sectional view of a display device according to an embodiment.

FIG. 2 is a schematic cross-sectional view of a display device according to an embodiment.

Although FIG. 2 illustrates a front emission type display device in which light L may be emitted in an emission area or areas EMA not in a direction of a first substrate on which a light emitting layer EML may be formed, but in a direction opposite to the direction of the first substrate (a direction of a second substrate), the display device 1 is not limited thereto. Non-emission areas NEM may be adjacent to the emission areas EMA.

Referring to FIG. 2, the display device 1 may include a first display panel 10, a second display panel 20 facing the first display panel 10, and a filling layer 30 between the first display panel 10 and the second display panel 20.

The first display panel 10 may include a first substrate SUB, a light emitting layer EML disposed on one surface of the first substrate SUB, and an encapsulation film ENC disposed on the light emitting layer EML.

The first substrate SUB of the first display panel 10 is an insulating substrate, and may include a transparent material.

A circuit layer CCL may be disposed on the first substrate SUB. The circuit layer CCL may drive a pixel PX and sub-pixels PX1, PX2, and PX3, and may include at least one thin film transistor (TFT). Details of the circuit layer CCL will be described later.

A pixel electrode PXE may be disposed on the circuit layer CCL. The pixel electrodes PXE may be disposed for each of the sub-pixels PX1, PX2, and PX3 of each pixel PX.

The pixel electrodes PXE of the neighboring sub-pixels PX1, PX2, and PX3 may be separated from each other. The pixel electrode PXE may be a first electrode of a light emitting element (refer to "EMD" in FIG. 4), for example, an anode electrode.

A pixel defining layer PDL may be disposed on one surface of the first substrate SUB along the boundary of the pixel PX and the boundary of each of the sub-pixels PX1, PX2, and PX3. The pixel defining layer PDL may include an organic insulating material or an inorganic insulating material. For example, the pixel defining layer PDL may include at least one of a polyimide resin, an acrylic resin, a silicon compound, and a polyacrylic resin.

A light emitting layer EML is disposed on the pixel electrode PXE exposed by the pixel defining layer PDL. In an embodiment in which the display device 1 is an organic light emitting display device, the light emitting layer EML may include an organic layer containing an organic material. The organic layer may include an organic light emitting layer, and in some cases, may include a hole injection/transport layer and/or an electron injection/transport layer as an auxiliary layer to assist light emission.

The light emitting layer EML may be entirely disposed on the pixel electrode PXE and the pixel defining layer PDL. The light emitting layer EML may emit blue light or ultraviolet light, and a color control structure may include a wavelength conversion layer WCL, so that colors for each of the sub-pixels PX1, PX2, and PX3 may be displayed. In other words, even in a case that the light emitting layer EML emits the same light, the first sub-pixel PX1, the second sub-pixel PX2, and the third sub-pixel PX3 may display different colors from each other. For example, the disclosure is not limited thereto, but the first sub-pixel PX1 may display a first color of a red color, the second sub-pixel PX2 may display a second color of a green color, and the third sub-pixel PX3 may display a third color of a blue color.

A common electrode CME may be disposed on the light emitting layer EML. The common electrode CME may be connected without distinguishing each pixel PX and each of the sub-pixels PX1, PX2, and PX3. The common electrode CME may be an entire electrode disposed on the entire surface of the light emitting layer EML without discriminating the pixels PX and sub-pixels PX1, PX2, and PX3. The common electrode CME may be a second electrode of the light emitting element (refer to "EMD" in FIG. 4), for example, a cathode electrode.

The pixel electrode PXE, the light emitting layer EML, and the common electrode CME may constitute a light emitting element (for example, an organic light emitting element). Light emitted from the light emitting layer EML may be emitted upward through the common electrode CME.

An encapsulation film ENC may be disposed on the common electrode CME. The encapsulation film ENC may include at least one encapsulation film. For example, the encapsulation film ENC may include a first inorganic film ENC1, an organic film ENC2, and a second inorganic film ENC3.

The second display panel 20 may be disposed over the encapsulation layer ENC to face the second display panel 20. The second display panel 20 may include a second substrate 21 and a color control structure (WCL, TPL, CFL) disposed on one surface of the second substrate 21 facing the first substrate SUB. The color control structure may include a color filter layer CFL and a wavelength conversion layer WCL. The color control structure may include a light transmitting layer TPL disposed at the same level as the wavelength conversion layer WCL in some or a predetermined number of pixels.

The second substrate 21 of the second display panel 20 may include a transparent material.

A light blocking member BM may be disposed on one surface of the second substrate 21 facing the first substrate SUB along the boundaries of the pixels PX and the sub-pixels PX1, PX2, and PX3.

The color filter layer CFL may be disposed on one surface of the second substrate 21 on which the light blocking member BM is disposed. The color filter layer CFL may be disposed on one surface of the second substrate 21 exposed through the openings of the light blocking member BM. The color filter layer CFL may be partially disposed on the adjacent light blocking member BM.

The color filter layer CFL may include a first color filter layer CFL1 disposed in the first sub-pixel PX1, a second color filter layer CFL2 disposed in the second sub-pixel PX2, and a third color filter layer CFL2 disposed in the third sub-pixel PX3. Each of the color filter layers CFL1, CFL2, and CFL3 may include a colorant such as a dye or pigment that absorbs wavelengths other than the corresponding color wavelength. The first color filter layer CFL1 may be a red color filter layer, the second color filter layer CFL2 may be a green color filter, and the third color filter layer CFL3 may be a blue color filter layer.

A first capping layer 22 may be disposed on the color filter layer CFL. The first capping layer 22 may prevent impurities such as moisture or air from penetrating from the outside to damage or contaminate the color filter layer CFL.

A partition wall PTL may be disposed on the first capping layer 22.

The wavelength conversion layer WCL and/or the light transmitting layer TPL may be disposed in a space exposed by the opening of the partition wall PTL. The wavelength conversion layer WCL and the light transmitting layer TPL may be formed by an inkjet process using the partition wall PTL as a bank, but the disclosure is not limited thereto.

In an embodiment in which the light emitting layer EML of each pixel PX emits light of the third color, the wavelength conversion layer WCL may include a first wavelength conversion pattern WCL1 disposed in the first sub-pixel PX1 and a second wavelength conversion pattern WCL2 disposed in the second sub-pixel PX2. The light transmitting layer TPL may be disposed in the third sub-pixel PX3.

The first wavelength conversion pattern WCL1 may include a first base resin BRS1 and a first wavelength conversion material WCP1 disposed in the first base resin BRS1 converting the third color to the first color. The second wavelength conversion pattern WCL2 may include a second base resin BRS2 and a second wavelength conversion material WCP2 disposed in the second base resin BRS2 converting the third color to the first color. The light transmitting layer TPL may include a third base resin BRS3 and a scatterers SCP disposed in the third base resin BRS3.

A second capping layer 23 may be disposed on the wavelength conversion layer WCL and the light transmitting layer TPL.

A filling layer 30 may be disposed between the first display panel 10 and the second display panel 20. The filling layer 30 may fill a space between the first display panel 10 and the second display panel 20, and may combine the first display panel 10 and the second display panel 20. The filling layer 30 may be disposed between the thin film encapsulation film ENC of the first display panel 10 and the second capping layer 23 of the second display panel 20.

Hereinafter, the circuit layer CCL of the display device 1 will be described in detail.

Figure 3:
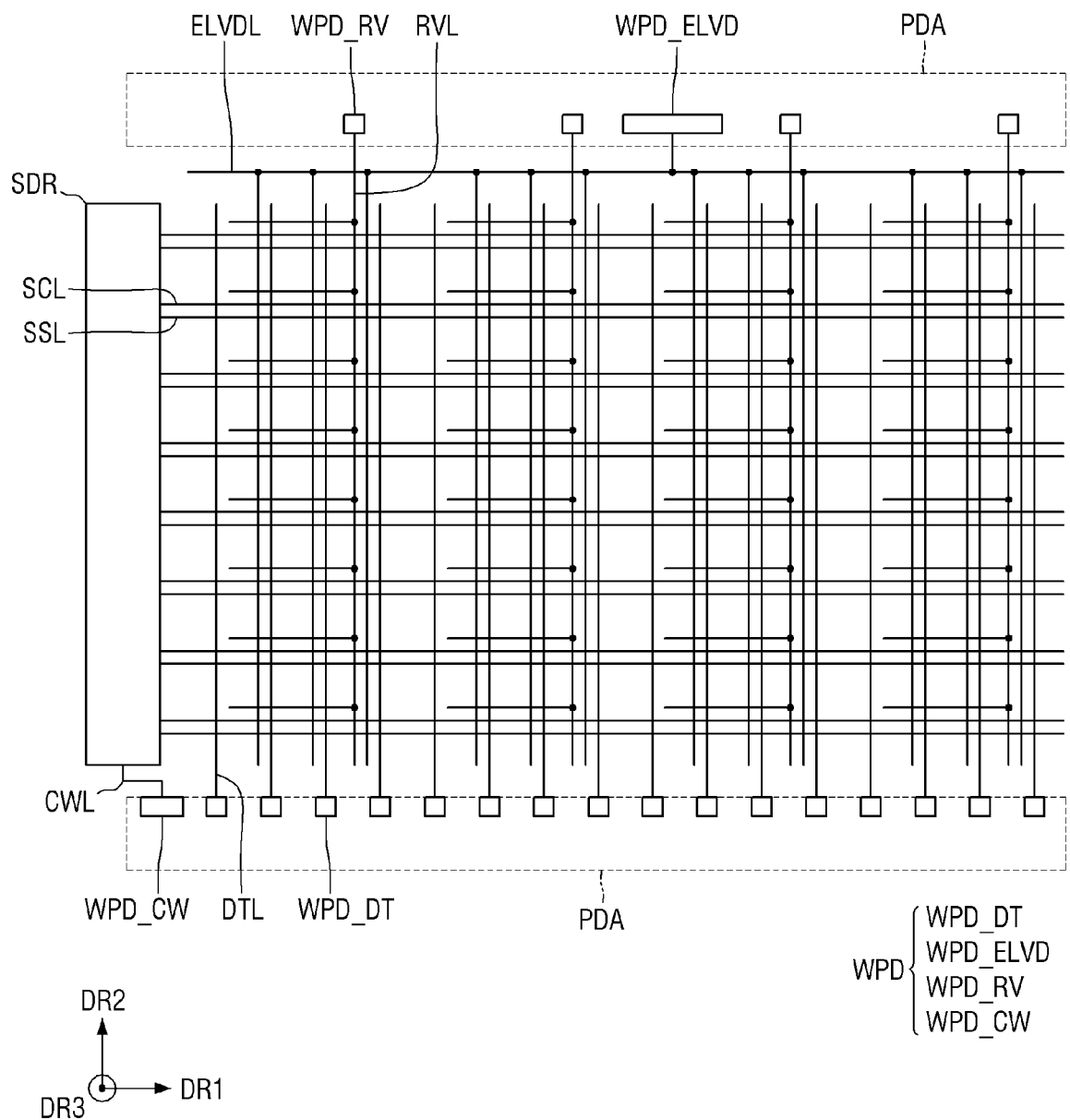
FIG. 3 is a schematic layout view of a circuit layer of a first display panel of a display device according to an embodiment.

FIG. 3 is a schematic layout view of a circuit layer of a first display panel of a display device according to an embodiment.

Referring to FIG. 3, lines may be disposed on the first substrate SUB. The lines may include a scan line SCL, a sensing line SSL, a data line DTL, a reference voltage line RVL, and a first power supply line ELVDL. Although not shown in the drawings, the wirings may include a second power supply line ELVSL. FIG. 3 also includes a pad area PDA.

The scan line SSL and the sensing line SSL may extend in the first direction DR1. The scan line SSL and the sensing line SSL may be electrically connected to a scan driver SDR. The scan driver SDR may include a driving circuit composed of the circuit layer CCL. The scan driver SDR may be disposed in a third non-display area NDA3 on the first substrate SUB, but the disclosure is not limited thereto. The scan driver SDR may be disposed in a fourth non-display area located or disposed at the opposite side of the third non-display area NDA3, or may be disposed in both the third non-display area NDA3 and the fourth non-display area. The scan driver SDR may be electrically connected to a signal connection line CWL, and at least one end of the signal connection line CWL may form a wiring pad WPD_CW on the first non-display area NDA1 and/or the second non-display area NDA2 to be electrically connected to the external device ('EXD' in FIG. 1).

The data line DTL and the reference voltage line RVL may extend in the second direction DR2 crossing or intersecting the first direction DR1. The first power supply line ELVDL may include a portion extending in the second direction DR2. The first power supply line ELVDL may include a portion extending in the first direction DR1. The first power supply line ELVDL may have a mesh structure, but the disclosure is not limited thereto.

Wiring pads WPD may be disposed on at least one end of the data line DTL, at least one end of the reference voltage line RVL, and at least one end of the first power supply line ELVDL. The wiring pads WPD may be disposed in the non-display area NDA. In an embodiment, the wiring pad of the data line DTL (WPD_DT, hereinafter referred to as 'data pad') may be disposed in the first non-display area NDA1, and the wiring pad of the reference voltage line RVL (WPD_RV, hereinafter 'reference voltage pad') and the wiring pad of the first power supply line ELVDL (WPD_ELVD, hereinafter referred to as the 'first power pad') may be disposed in the second non-display area NDA2. In an embodiment, all of the data pad WPD_DT, the reference voltage pad WPD_RV, and the first power pad WPD_ELVD may be disposed in the same area, for example, the first non-display area NDA1. The external device ('EXD' in FIG. 1) may be mounted on the wiring pad WPD as described above. The external device EXD may be mounted on the wiring pad WPD through an anisotropic conductive film, ultrasonic bonding, or the like without departing from the spirit and the scope of the disclosure.

Each pixel PX on the first substrate SUB includes a pixel driving circuit. The above-described lines may apply driving signals to each pixel driving circuit while passing through or around each pixel PX. The pixel driving circuit may include a transistor and a capacitor. The number of transistors and capacitors in each pixel driving circuit may be variously changed. Hereinafter, a pixel driving circuit having a 3T1C including three transistors and one capacitor will be described as an example, but the disclosure is not limited thereto, and pixel driving circuits having various structures such as 2T1C, 7T1C, and 6T1C may be applied.

Figure 4:
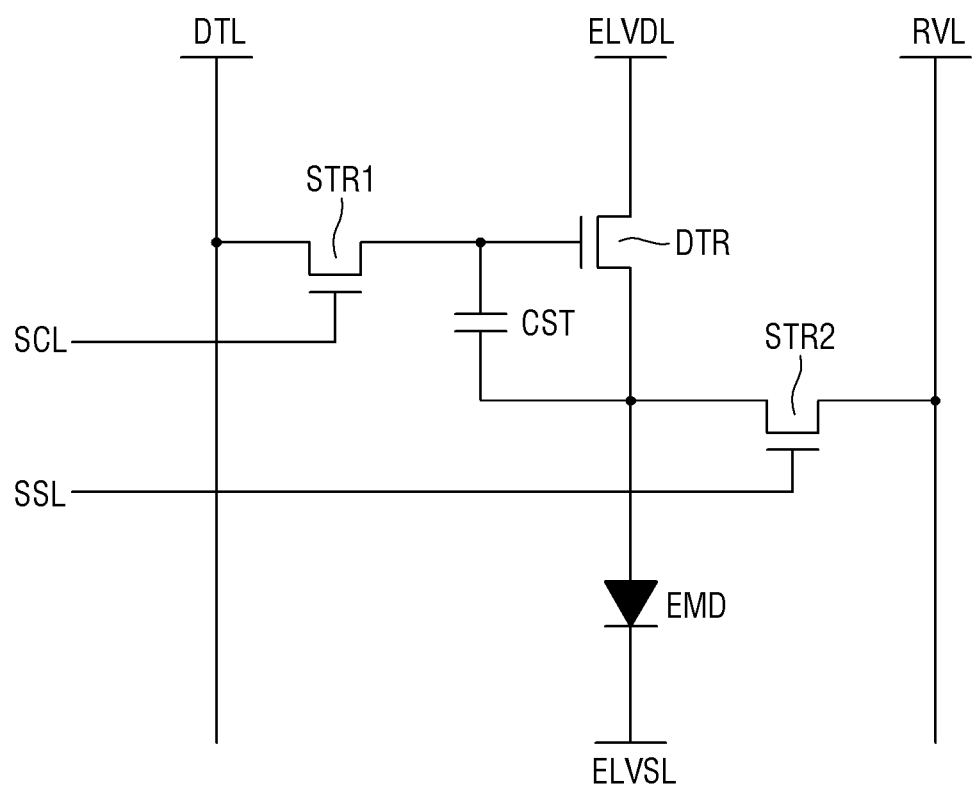
FIG. 4 is an equivalent circuit diagram of one pixel of a display device according to an embodiment.

FIG. 4 is an equivalent circuit diagram of one pixel of a display device according to an embodiment.

Referring to FIG. 4, each pixel PX of a display device according to an embodiment includes three transistors DTR, STR1, and STR2 and one storage capacitor CST in addition to the light emitting element EMD.

The light emitting element EMD emits light according to a current supplied through the driving transistor DTR. The light emitting element EMD may be implemented as an organic light emitting diode, a micro light emitting diode, or a nano light emitting diode.

The first electrode (that is, an anode electrode, for example) of the light emitting element EMD may be electrically connected to a source electrode of the driving transistor DTR, and the second electrode (that is, a cathode electrode, for example) thereof may be electrically connected to the second power supply line ELVSL to which a low-potential voltage (not illustrated second power voltage, ELVS) lower than a high-potential voltage (not illustrated first power voltage, ELVD) of the first power supply line ELVDL may be supplied.

The driving transistor DTR adjusts a current flowing from the first power supply line ELVDL to which the first power voltage is supplied to the light emitting element EMD according to a difference in voltage between a gate electrode and a second source/drain electrode. The gate electrode of the driving transistor DTR may be electrically connected to the second source/drain electrode of the first switching transistor STR1, the first source/drain electrode thereof may be electrically connected to the first power supply line ELVDL to which the first power voltage ELVD is applied, and the second source/drain electrode thereof may be electrically connected to the first electrode of the light emitting element EMD.

The first switching transistor STR1 is turned on by the scan signal of the scan line SCL to electrically connect the data line DTL to the gate electrode of the driving transistor DTR. The gate electrode of the first switching transistor STR1 may be electrically connected to the scan line SCL, the first source/drain electrode thereof may be electrically connected to the data line DTL, and the second source/drain electrode thereof may be electrically connected to the gate electrode of the driving transistor DTR.

The second switching transistor STR2 may be turned on by the sensing signal of the sensing line SSL to electrically connect the reference voltage line RVL to the second source/drain electrode of the driving transistor DTR. The gate electrode of the second switching transistor STR2 may be electrically connected to the sensing line SSL, the first source/drain electrode thereof may be electrically connected to the reference voltage line RVL, and the second source/drain electrode thereof may be electrically connected to the second source/drain electrode of the driving transistor DTR.

In an embodiment, the first source/drain electrode of each of the first and second switching transistors STR1 and STR2 may a source electrode, and the second source/drain electrode thereof may be a drain electrode, but the disclosure is not limited thereto, and vice versa.

The storage capacitor CST may be formed or disposed between the gate electrode and second source/drain electrode of the driving transistor DTR. The storage capacitor CST may store a difference voltage between the gate voltage and second source/drain voltage of the driving transistor DTR.

The driving transistor DTR and the first and second switching transistors STR1 and STR2 may be formed as thin film transistors. Although it is illustrated in FIG. 3 that the driving transistor DTR and the first and second switching transistors STR1 and STR2 are formed as N-type metal oxide semiconductor field effect transistors (MOSFETs), the disclosure is not limited thereto. For example, the driving transistor DTR and the first and second switching transistors STR1 and STR2 may be formed as P-type MOSFETs, or some or a predetermined number of them may formed as N-type MOSFETs and others of them may be formed as P-type MOSFETs.

Hereinafter, a structure of one pixel of the display device 1 according to an embodiment will be described in detail with reference to other drawings.

Figure 5:
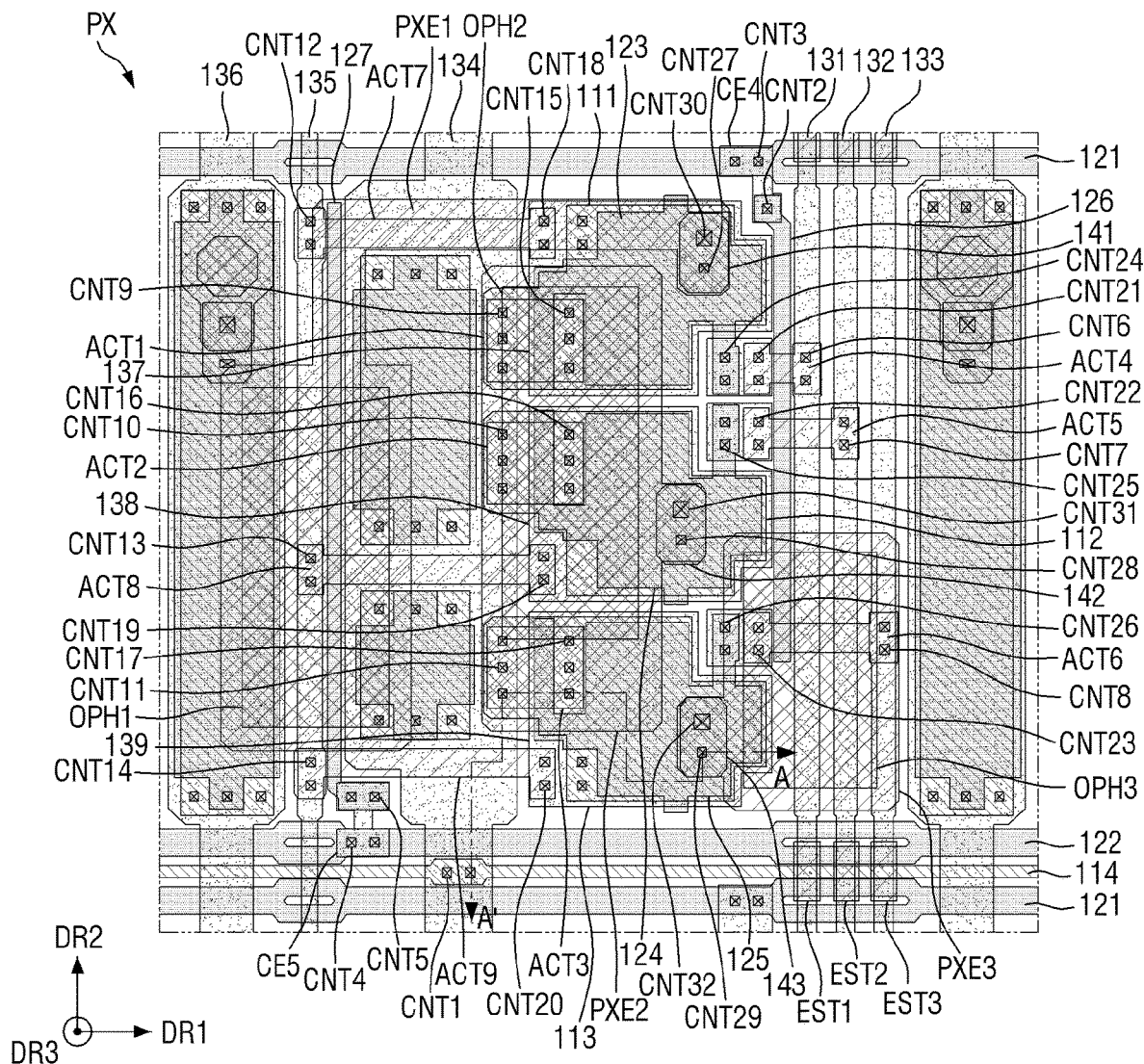
FIG. 5 is a layout view of one pixel of a display device according to an embodiment.
Figure 6:
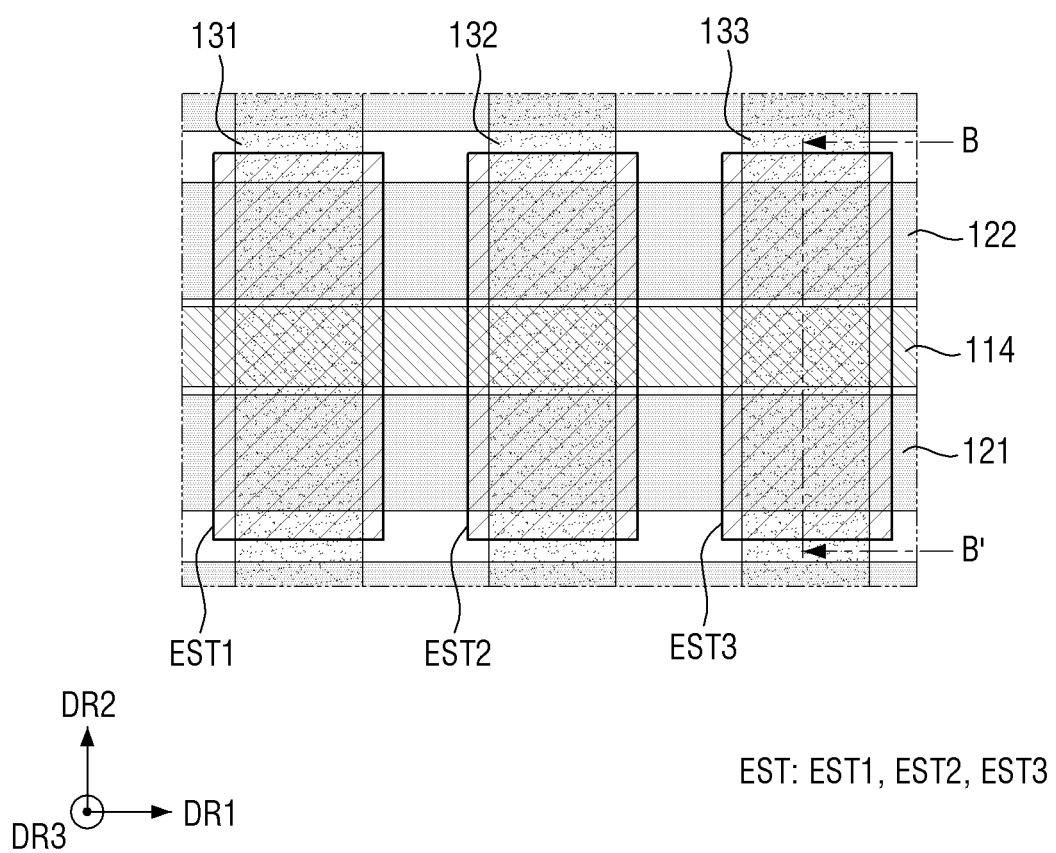
FIG. 6 is an enlarged view of an area in which an etch-prevention pattern is placed in the layout view of FIG. 5.
Figure 7:
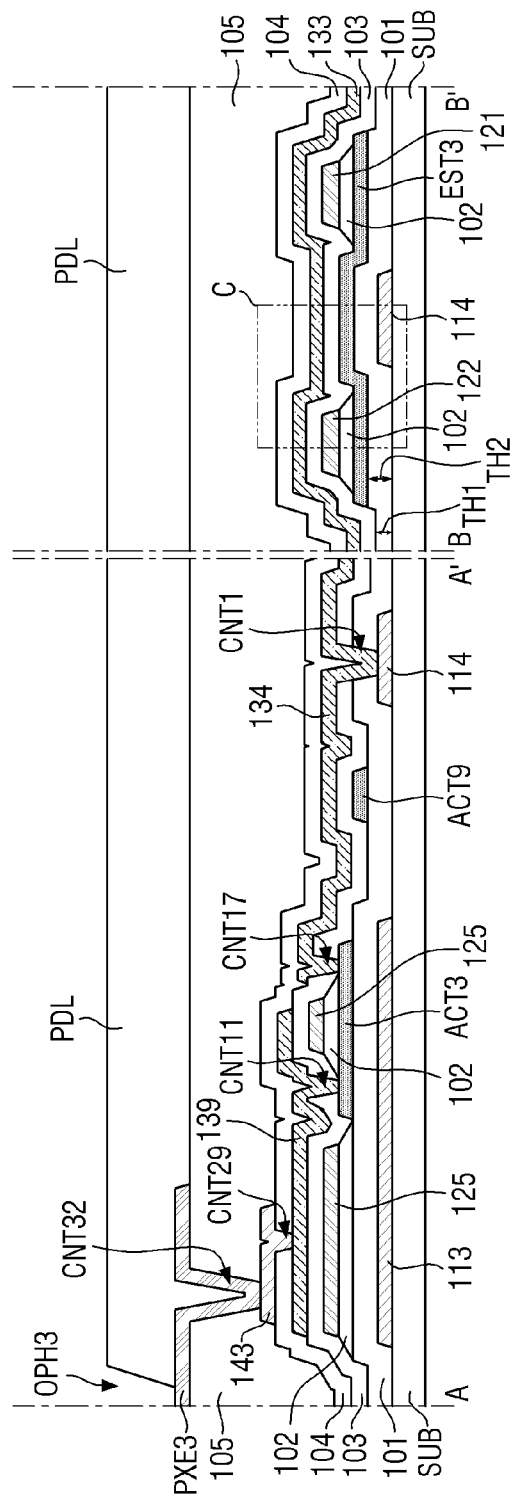
FIG. 7 is a schematic cross-sectional view taken along the lines A-A' and B-B' of FIG. 6.

FIG. 5 is a layout view of one pixel of a display device according to an embodiment, FIG. 6 is an enlarged view of an area in which an etch-prevention pattern is placed in the layout view of FIG. 5, and FIG. 7 is a schematic cross-sectional view taken along the lines A-A' and B-B' of FIG. 6.

In one pixel PX illustrated in FIGS. 5 to 7, a part thereof may constitute a first sub-pixel PX1, another part thereof may constitute a second sub-pixel PX2, and another part thereof may constitute a third sub-pixel PX3. Each of the sub-pixels PX1, PX2, and PX3 may include transistors, a storage capacitor, and lines as in the equivalent circuit diagram described above with reference to FIG. 4. It is shown in FIGS. 5 to 7 that three sub-pixels PX1, PX2, and PX3 each including a driving transistor DTR, a first switching transistor STR1, a second switching transistor STR2, and a storage capacitor CST may be arranged or disposed. The sub-pixels PX1, PX2, and PX3 may be electrically connected to different data lines from each other, and may be electrically connected to the same power supply line. Hereinafter, layers disposed in the pixels PX or sub-pixels PX1, PX2, and PX3 of the display device 1 will be described with reference to the drawings. However, for convenience of description, layers arranged or disposed in one sub-pixel (for example, the third sub-pixel PX3) will be described, and a redundant description of layers arranged or disposed in other sub-pixels will be briefly described.

Referring to FIGS. 5 to 7, the circuit layer CCL includes a semiconductor layer SC, conductive layers, and insulating layers, which may be disposed on the first substrate SUB. The conductive layers may include a first conductive layer 110, a second conductive layer 120, a third conductive layer 130, a fourth conductive layer 140, and a pixel electrode PXE. The insulating layers may include a buffer layer 101, a gate insulating film 102, an interlayer insulating film 103, a passivation film 104, and a via layer 105.

As an example, the first conductive layer 110 is disposed on the first substrate SUB. The first conductive layer 110 may include a first lower light blocking pattern 111, a second lower light blocking pattern 112, a third lower light blocking pattern 113, and a first power supply line 114. The first conductive layer 110 may be formed as a Ti/Cu double layer in which a titanium layer and a copper layer are stacked, but the disclosure is not limited thereto.

The first lower light blocking pattern 111, the second lower light blocking pattern 112, and the third lower light blocking pattern 113 may be light blocking layers that protect the semiconductor layer SC from external light. The first lower light blocking pattern 111, the second lower light blocking pattern 112, and the third lower light blocking pattern 113 have patterned shapes. The first lower light blocking pattern 111, the second lower light blocking pattern 112, and the third lower light blocking pattern 113 may be disposed to cover or overlap a channel region of the semiconductor layer SC, and may be disposed to cover or overlap the entire semiconductor layer SC.

The first power supply line 114 extends in the first direction DR1, and a first power voltage ELVD may be applied to the first power supply line. The first power supply line 114 of the first conductive layer 110 may form a mesh structure together with the first power supply line 134 of the third conductive layer 130 to be described later, and may be electrically connected to the first power supply line 134 of the third conductive layer 130 through a contact hole CNT1 penetrating the interlayer insulating film 103 and the buffer layer 101 in the thickness direction (third direction DR3) to expose a part of the first power supply line 114 of the first conductive layer 110.

The buffer layer 101 is disposed on the first conductive layer 110. The buffer layer 101 may be disposed to cover or overlap the entire surface of the first substrate SUB on which the first conductive layer 110 may be formed or disposed. The buffer layer 101 may include silicon nitride, silicon oxide, or silicon oxynitride. In an embodiment, the buffer layer 101 may include a double layer of SiNx/SiOx.

The semiconductor layer SC is disposed on the buffer layer 101. The semiconductor layer SC may include first to ninth semiconductor patterns ACT1, ACT2, ACT3, ACT4, ACT5, ACT6, ACT7, ACT8, and ACT9 and an etch-prevention pattern EST (or semiconductor dummy pattern).

The first to third semiconductor patterns ACT1, ACT2, and ACT3 may be active layers of the driving transistor DTR included in one pixel PX, the fourth to sixth semiconductor patterns ACT4, ACT5, and ACT6 may be active layers of the first switching transistor STR1 included in one pixel PX, and the seventh to ninth semiconductor patterns ACT7, ACT8, and ACT9 may be active layers of the second switching transistor STR2 included in one pixel PX.

The first to ninth semiconductor patterns ACT1, ACT2, ACT3, ACT4, ACT5, ACT6, ACT7, ACT8, and ACT9 extend in the first direction DR1, that is, in the horizontal direction on the drawing, and may have a substantially rectangular shape or a shape in which both ends may be extended to have wider widths. Each of the first to ninth semiconductor patterns ACT1, ACT2, ACT3, ACT4, ACT5, ACT6, ACT7, ACT8, and ACT9 may include a channel region overlapping the gate electrode in the thickness direction (third direction DR3) and a conducting region located or disposed on one or a side and the other or another side of the channel region. The conducting region may have higher conductivity and lower electrical resistance than the channel region. The conducting region of each of the first to ninth semiconductor patterns ACT1, ACT2, ACT3, ACT4, ACT5, ACT6, ACT7, ACT8, and ACT9 may include a source electrode and a drain electrode (or a first source/drain electrode and a second source/drain electrode) of each transistor in an area overlapping the third conductive layer 130.

The first to third semiconductor patterns ACT1, ACT2, and ACT3 may be located or disposed near the center in one pixel PX based on the first direction DR1. The first semiconductor pattern ACT1 may be located or disposed above the second semiconductor pattern ACT2 and the third semiconductor pattern ACT3 in the drawing based on the second direction DR2, and the second semiconductor pattern ACT2 may be located or disposed above the third semiconductor pattern ACT3 in the drawing based on the second direction DR2. The first semiconductor pattern ACT1 may be an active layer of the driving transistor DTR of the first sub-pixel PX1, the second semiconductor pattern ACT2 may be an active layer of the driving transistor DTR of the second sub-pixel PX2, and the third semiconductor pattern ACT3 may be an active layer of the driving transistor DTR of the third sub-pixel PX3.

The fourth to sixth semiconductor patterns ACT4, ACT5, and ACT6 may be located or disposed at the right side of the drawing based on the first direction DR1 in one pixel PX. The fourth semiconductor pattern ACT4 may be located or disposed above the fifth semiconductor pattern ACT5 and the sixth semiconductor pattern ACT6 in the drawing based on the second direction DR2, and the fifth semiconductor pattern ACT5 may be located or disposed above the sixth semiconductor pattern ACT6 in the drawing based on the second direction DR2. The fourth semiconductor pattern ACT4 may be an active layer of the first switching transistor STR1 of the first sub-pixel PX1, the fifth semiconductor pattern ACT5 may be an active layer of the first switching transistor STR1 of the second sub-pixel PX2, and the sixth semiconductor pattern ACT6 may be an active layer of the first switching transistor STR1 of the third sub-pixel PX3.

The seventh to ninth semiconductor patterns ACT7, ACT8, and ACT9 may be located or disposed at the left side of the drawing based on the first direction DR1 in one pixel PX. The seventh semiconductor pattern ACT7 may be located or disposed above the eighth semiconductor pattern ACT8 and the ninth semiconductor pattern ACT9 in the drawing based on the second direction DR2, and the eighth semiconductor pattern ACT8 may be located or disposed above the ninth semiconductor pattern ACT9 in the drawing based on the second direction DR2. The seventh semiconductor pattern ACT7 may be an active layer of the second switching transistor STR2 of the first sub-pixel PX1, the eighth semiconductor pattern ACT8 may be an active layer of the first switching transistor STR1 of the second sub-pixel PX2, and the ninth semiconductor pattern ACT9 may be an active layer of the second switching transistor STR2 of the third sub-pixel PX3.

The etch-prevention pattern EST may be formed in an island or isolated shape separated from the active layers of the driving transistor DTR, the first switching transistor STR1, and the second switching transistor STR2. The etch-prevention pattern EST may be a semiconductor dummy pattern. In other words, the etch-prevention pattern EST includes the same or similar material as the first to ninth semiconductor patterns ACT1, ACT2, ACT3, ACT4, ACT5, ACT6, ACT7, ACT8, and ACT9, and may be formed by the same or similar process, but may be formed to be separated from the ninth semiconductor pattern ACT1, ACT2, ACT3, ACT4, ACT5, ACT6, ACT7, ACT8, and ACT9. Moreover, the etch-prevention pattern EST may not be electrically connected to other components (for example, transistors DTR, STR1, STR2 of each of the sub-pixels PX1, PX2, and PX3), and the first power voltage ELVD and the data voltage may not be applied to the etch-prevention pattern EST. For example, the etch-prevention pattern EST may be a dummy pattern insulated from signal lines and electrodes.

The etch-prevention pattern EST may include a first etch-prevention pattern EST1, a second etch-prevention pattern EST2, and a third etch-prevention pattern EST3, which are separated from each other. The first to third etch-prevention patterns EST1, EST2, and EST3 may be disposed at areas in which scan lines 121 and sensing lines 122 extending in the first direction DR1 intersect the first to third data lines 131, 132, and 133 extending in the second direction DR2, respectively. In other words, each of the first to third etch-prevention patterns EST1, EST2, and EST3 may be disposed between the first power supply line 114 of the first conductive layer 110 and the scan line 121 of the second conductive layer 120 and/or between the first power supply line 114 of the first conductive layer 110 and the sensing line 122 of the second conductive layer 120 in the second direction DR2. In the area therebetween, the first etch-prevention pattern EST1 may be disposed to overlap the first data line 131, the second etch-prevention pattern EST2 may be disposed to overlap the second data line 132, and the third etch-prevention pattern EST3 may be disposed to overlap the third data line 133.

As the etch-prevention pattern EST is disposed, over-etch of the buffer layer 101 around the gate insulating film 102 may be suppressed. In this case, it may be possible to suppress or prevent the disconnection (data opening) of some or a predetermined number of the first to third data lines 131, 132, and 133 between the first power supply line 114 and sensing line of the first conductive layer 110 or suppress or prevent the short between the neighboring first to third data lines 131, 132, and 133. Moreover, since the etch-prevention pattern EST may be formed together in the process of forming the semiconductor layer SC, an additional mask (or process) may be unnecessary. Details of the etch-prevention pattern EST will be described later.

The semiconductor layer SC may include an oxide semiconductor. The oxide semiconductor may include indium-tin oxide (ITO), indium-gallium-tin oxide (ITGO), indium-gallium-zinc oxide (IGZO), or indium-gallium-zinc-tin oxide (IGZTO). However, the disclosure is not limited thereto, and the semiconductor layer SC may include polycrystalline silicon, monocrystalline silicon, or amorphous silicon.

The gate insulating film 102 is disposed on the semiconductor layer SC. The gate insulating film 102 may be formed in substantially the same pattern as the second conductive layer 120 to be described later. In other words, the gate insulating film 102 may be formed in a pattern corresponding to the pattern of the second conductive layer 120. Although the pattern of the gate insulating film 102 may be formed substantially the same as the pattern of the second conductive layer 120, the pattern of the gate insulating film 102 may have a shape enlarged from the pattern of the second conductive layer 120. Although the pattern shape of the gate insulating film 102 is substantially the same as the pattern shape of the second conductive layer 120, the size of the pattern of the gate insulating film 102 may be different from the size of the pattern of the second conductive layer 120, and the size of the pattern of the gate insulating film 102 may be larger than the size of the pattern of the second conductive layer 120. The entire second conductive layer 120 completely overlaps the gate insulating film 102, whereas only a part of the gate insulating film 102 may overlap the second conductive layer 120.

The side surface of the gate insulating film 102 may be formed or disposed to protrude outward from the side surface of the second conductive layer 120. Although the entire second conductive layer 120 overlaps the gate insulating film 102, a part of the gate insulating film 102 may overlap the second conductive layer 120, and a portion of the gate insulating film, not overlapping the second conductive layer 120, may protrude outward from the second conductive layer 120. However, the disclosure is not limited thereto, and the first edge (or lower end) of the second conductive layer 120 where the lower surface of the second conductive layer 120 meets the side surface of the second conductive layer 120 may be in direct contact with the second edge (refer to '102b' in FIG. 8 or upper end) of the gate insulating film 102 where the upper surface of the gate insulating film 102 meets the side surface of the gate insulating film 102. The first edge (refer to '102a' in FIG. 8 or the lower end) of the gate insulating film 102 where the lower surface of the gate insulating film 102 meets the side surface of the gate insulating film 102 may be disposed outside the sensing line 122 which is part of the second conductive layer 120, rather than the second edge (refer to '102b' in FIG. 8) of the gate insulating film 102. However, the disclosure is not limited thereto.

The gate insulating film 102 may include a silicon compound or a metal oxide. For example, the gate insulating film 102 may include silicon oxide, silicon nitride, silicon oxynitride, aluminum oxide, tantalum oxide, hafnium oxide, zirconium oxide, or titanium oxide. In an embodiment, the gate insulating film 102 may include an SiOx film.

The second conductive layer 120 is disposed on the gate insulating film 102. The second conductive layer 120 may include a scan line 121, a sensing line 122, and first to third gate conductive patterns 123, 124, and 125. Hereinafter, the scan line 121 is the scan line SCL of FIG. 4, and the sensing line 122 is substantially the same as the sensing line SSL of FIG. 4, but different reference numerals are used for convenience of explanation.

The scan line 121 may transmit a scan signal to the first switching transistor STR1 of each of the sub-pixels PX1, PX2, and PX3, and the sensing line 122 may transmit a sensing signal to the second switching transistor STR2 of each of the sub-pixels PX1, PX2, and PX3. The first to third gate conductive patterns 123, 124, and 125 may overlap the first to third semiconductor patterns ACT1, ACT2, and ACT3 to form a gate electrode of the driving transistor DTR of each of the sub-pixels PX1, PX2, and PX3.

The scan line 121 is located or disposed above the one pixel PX in the drawing and extends in the first direction DR1. The scan line 121 may extend to another pixel PX located or disposed adjacent to one pixel PX in the first direction DR1.

The sensing line 122 is located or disposed below the one pixel PX in the drawing and extends in the first direction DR1. The sensing line 122 may extend to another pixel PX located or disposed adjacent to one pixel PX in the first direction DR1.

The scan line 121 and sensing line 122 extending in the first direction DR1 may be bifurcated in an area intersecting the first to third data lines 131, 132, and 133 and the reference voltage line 135 extending in the second direction DR2, and may extend in the first direction DR1. In other words, the scan line 121 and the sensing line 122 may extend from one or a side and the other or another side of the first to third data lines 131, 132, and 133 and the reference voltage line 135 to one line in the first direction DR1, and may be bifurcated in area intersecting the first to third data lines 131, 132, and 133 and the reference voltage line 135 and extend in the first direction DR1.

The second conductive layer 120 may include a first extension portion 126 and a second extension portion 127. The first extension portion 126 may be located or disposed at the right side of the pixel PX in the drawing and may extend in the second direction DR2. The first extension portion 126 is separated from the scan line 121, but may be electrically connected to the scan line 121 through the contact holes CNT2 and CNT3 penetrating the interlayer insulating film 103 in the thickness direction (third direction DR3) to expose a part of the scan line 121 and a part of the first extension portion 126, respectively, and the fourth contact pattern CE4 of the third conductive layer 130. However, the disclosure is not limited thereto, and the first extension portion 126 may be branched from the scan line 121 and extend in the second direction DR2. The first extension portion 126 may overlap some or a predetermined number of the fourth to sixth semiconductor patterns ACT4, ACT5, and ACT6. The first extension portion 126 may form a gate electrode of the first switching transistors STR1 of each of the first to third sub-pixels PX1, PX2, and PX3 in the overlapping area. The first switching transistor STR1 of each of the first to third sub-pixels PX1, PX2, and PX3 may receive a scan signal input from the scan line 121 through the first extension portion 126.

The second extension portion 127 may be located or disposed at the left side of the pixel PX in the drawing and may extend in the second direction DR2. The second extension portion 127 may be electrically connected to the sensing line 122 through the contact holes CNT4 and CNT5 penetrating the interlayer insulating film 103 in the thickness direction (third direction DR3) to expose a part of the sensing line 122 and a part of the second extension portion 127, respectively, and the fifth contact pattern CE5 of the third conductive layer 130. However, the disclosure is not limited thereto, and the second extension portion 127 may be branched from the sensing line 122 and extend in the second direction DR2. The second extension portion 127 may overlap some or a predetermined number of the seventh to ninth semiconductor patterns ACT7, ACT8, and ACT9. The second extension portion 127 may form a gate electrode of the second switching transistors STR2 of each of the first to third sub-pixels PX1, PX2, and PX3 in the overlapping area. The second switching transistor STR2 of each of the first to third sub-pixels PX1, PX2, and PX3 may receive a scan signal input from the sensing line 122 through the second extension portion 127.

The first to third gate conductive patterns 123, 124, and 125 may be disposed between the first extension portion 126 and the second extension portion 127. Each of the first to third gate conductive patterns 123, 124, and 125 may partially overlap the first to third semiconductor patterns ACT1, ACT2, and ACT3. The first to third gate conductive patterns 123, 124, and 125 may include gate electrodes of respective transistors in the overlapping area. In other words, the first gate conductive pattern 123 may overlap a part of the first semiconductor pattern ACT1 to form a gate electrode of the driving transistor DTR of the first sub-pixel PX1. The first gate conductive pattern 123 may overlap at least the channel region of the first semiconductor pattern ACT1. Similarly, the second gate conductive pattern 124 may overlap a part of the second semiconductor pattern ACT2 and the third gate conductive pattern 125 may overlap a part of the third semiconductor pattern ACT3. The second gate conductive pattern 124 and the third gate conductive pattern 125 may form a gate electrode of the driving transistor DTR of the second sub-pixel PX2 and a gate electrode of the driving transistor DTR of the third sub-pixel PX3, respectively.

The first to third gate conductive patterns 123, 124, and 125 may overlap a part of the second conductive layer 120 to be described later, and may form one electrode of the storage capacitor CST of each of the first to third sub-pixels PX1, PX2, and PX3 in the overlapping area.

The second conductive layer 120 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 120 may be a single layer or multiple layers.

The interlayer insulating film 103 is disposed on the second conductive layer 120. The interlayer insulating film 103 may include an inorganic insulating material such as silicon oxide, silicon nitride, silicon oxynitride, hafnium oxide, aluminum oxide, titanium oxide, tantalum oxide, or zinc oxide. In an embodiment, the interlayer insulating film 103 may include SiON.

The third conductive layer 130 may be disposed on the interlayer insulating film 103. The third conductive layer may include a first data line 131, a second data line 132, a third data line 133, a first voltage line 134, a reference voltage line 135, a second voltage line 136, first to third data patterns 137, 138, and 139, and contact patterns CE including first to fifth contact patterns CE1, CE2, CE3, CE4, and CE5. Hereinafter, the first to third data lines 131, 132, and 133 are substantially the same as the data line DTL of FIG. 4, the first power supply line 134 is substantially the same as the first power supply line ELVDL of FIG. 4, the reference voltage line 135 is substantially the same as the reference voltage line RVL in FIG. 4, and the second power supply line 136 is substantially the same as the second power supply line ELVSL in FIG. 4, but for convenience of explanation, different reference numerals are used.

The first to third data lines 131, 132, and 133 may transmit a data signal to each of the sub-pixels PX1, PX2, and PX3. The first data lines 131, 132, and 133 may be disposed at one or a side of the pixel PX, for example, the right side of the pixel PX in the first direction DR1 with respect to the center of the pixel PX, and may extend in the second direction DR2. The first data lines 131, 132, and 133 may extend to another pixel PX located or disposed adjacent to one pixel PX in the second direction DR2.

The first data line 131 may overlap the fourth semiconductor pattern ACT4, and may be electrically connected to the fourth semiconductor pattern ACT4 through the contact hole CNT6 penetrating the interlayer insulating film 103 to expose a part of the fourth semiconductor pattern ACT4 in the overlapping area. Accordingly, a data signal may be transmitted to the first switching transistor STR1 of the first sub-pixel PX1 through the first data line 131. The second data line 132 may overlap the fifth semiconductor pattern ACT5, and may be electrically connected to the fifth semiconductor pattern ACT5 through the contact hole CNT7 penetrating the interlayer insulating film 103 to expose a part of the fifth semiconductor pattern ACT5 in the overlapping area. Accordingly, a data signal may be transmitted to the first switching transistor STR1 of the second sub-pixel PX2 through the second data line 132. The third data line 133 may overlap the sixth semiconductor pattern ACT6, and may be electrically connected to the sixth semiconductor pattern ACT6 through the contact hole CNT8 penetrating the interlayer insulating film 103 to expose a part of the sixth semiconductor pattern ACT6 in the overlapping area. Accordingly, a data signal may be transmitted to the first switching transistor STR1 of the third sub-pixel PX3 through the third data line 133.

The first power supply line 134 may transmit a first power voltage ELVD to each of the sub-pixels PX1, PX2, and PX3. The first power supply line 134 may be disposed at one or a side of the pixel PX, for example, the left side of the pixel PX in the first direction DR1 with respect to the center of the pixel PX, and may extend in the second direction DR2. The first power supply line 134 may extend to another pixel PX located or disposed adjacent to one pixel PX in the second direction DR2. The first power supply line 134 may overlap the first to third semiconductor patterns ACT1, ACT2, and ACT3, and may be electrically connected to the first to third semiconductor patterns ACT1, ACT2, and ACT3 through the contact holes CNT9, CNT10, and CNT11 penetrating the interlayer insulating film 103 to expose a part of each of the first to third semiconductor patterns ACT1, ACT2, and ACT3 in the overlapping area. Accordingly, the first power voltage ELVD may be transmitted to the driving transistor DTR of each of the sub-pixels PX1, PX2, and PX3 through the first power supply line 134.

The reference voltage line 135 may transmit a reference voltage (not illustrated RV) to each of the sub-pixels PX1, PX2, and PX3. The reference voltage line 135 may be disposed at one or a side of the first power supply line 134, for example, the left side of the first power supply line 134 in the first direction DR1, and may extend in the second direction DR2. The reference voltage line 135 may extend to another pixel PX located or disposed adjacent to one pixel PX in the second direction DR2. The reference voltage line 135 may overlap the seventh to ninth semiconductor patterns ACT7, ACT8, and ACT9, and may be electrically connected to the seventh to ninth semiconductor patterns ACT7, ACT8, and ACT9 through the contact holes CNT12, CNT13, and CNT14 penetrating the interlayer insulating film 103 to expose a part of each of the seventh to ninth semiconductor patterns ACT7, ACT8, and ACT9 in the overlapping area. Accordingly, the reference voltage (not illustrated RV) may be transmitted to the second switching transistor STR2 of each of the sub-pixels PX1, PX2, and PX3 through the reference voltage line 135.

The second voltage line 136 may transmit a second power voltage ELVS to each of the sub-pixels PX1, PX2, and PX3. The second voltage line 136 may be disposed at one or a side of the reference voltage line 135, for example, the left side of the reference voltage line 135 in the first direction DR1, and may extend in the second direction DR2. The second voltage line 136 may extend to another pixel PX located or disposed adjacent to one pixel PX in the second direction DR2.

The first to third data conductive patterns 137, 138, and 139 and the first to fifth contact patterns CE1, CE2, CE3, CE4, and CE5 may be disposed between the first data lines 131, 132, and 133, and the first power supply line 134.

The first to third data conductive patterns 137, 138, and 139 may overlap the first to third semiconductor patterns ACT1, ACT2, ACT3, and the seventh to ninth semiconductor patterns ACT7, ACT8, ACT9, respectively. In the overlapping area, each of the first to third data conductive patterns 137, 138, and 139 may be electrically connected to the first to third semiconductor patterns ACT1, ACT2, and ACT3 through the contact holes CNT15, CNT16, and CNT17 penetrating the interlayer insulating film 103 to expose some or a predetermined number of the first to third semiconductor patterns ACT1, ACT2, and ACT3, and may be electrically connected to the seventh to ninth semiconductor patterns ACT7, ACT8, and ACT9 through the contact holes CNT18, CNT19, and CNT20 penetrating the interlayer insulating film 103 to expose some or a predetermined number of the seventh to ninth semiconductor patterns ACT7, ACT8, ACT9. The first to third data conductive patterns 137, 138, and 139 may include second source/drain electrodes of the driving transistor DTR and second switching transistor STR2 of each of the sub-pixels PX1, PX2, and PX3.

The first to third contact patterns CE1, CE2, and CE3 may overlap the fourth to sixth semiconductor patterns ACT4, ACT5, ACT6 and the first to third gate conductive patterns 123, 124, and 125, respectively. In the overlapping area, each of the first to third contact patterns CE1, CE2, and CE3 may be electrically connected to the fourth to sixth semiconductor patterns ACT4, ACT5, ACT6 through the contact holes CNT21, CNT22, and CNT23 penetrating the interlayer insulating film 103 to expose some or a predetermined number of the fourth to sixth semiconductor patterns ACT4, ACT5, ACT6, and may be electrically connected to the first to third gate conductive patterns 123, 124, and 125 through the contact holes CNT24, CNT25, and CNT26 penetrating the interlayer insulating film 103 to expose some or a predetermined number of the first to third gate conductive patterns 123, 124, and 125. In other words, each of the fourth to sixth semiconductor patterns ACT4, ACT5, and ACT6 may be electrically connected to the fourth to sixth semiconductor patterns ACT4, ACT5, and ACT6 through the first to third contact patterns CE1, CE2, and CE3.

The first to third contact patterns CE1, CE2, and CE3 may include a second source/drain electrode of the first switching transistor STR1 of each of the sub-pixels PX1, PX2, and PX3. The first to third contact patterns CE1, CE2, and CE3 may overlap the first to third gate conductive patterns 123, 124, and 125 to constitute the other electrode (or second electrode) of the storage capacitor CST of each of the sub-pixels PX1, PX2, and PX3.

The fourth contact pattern CE4 may overlap the scan line 121 and the first extension portion 126. In the overlapping area, the fourth contact pattern CE4 may be electrically connected to the scan line 121 through the contact hole CNT3, and may be electrically connected to the first extension portion 126 through the contact hole CNT2. For example, the scan line 121 and the first extension portion 126 may be electrically connected to each other through the fourth contact pattern CE4.

The fifth contact pattern CE5 may overlap the sensing line 122 and the second extension portion 127. In the overlapping area, the fifth contact pattern CE5 may be electrically connected to the second extension portion 127 through the contact hole CNT4, and may be electrically connected to the sensing line 122 through the contact hole CNT5. For example, the sensing line 122 and the second extension portion 127 may be electrically connected to each other through the fifth contact pattern CE5.

The third conductive layer 130 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 130 may be a single layer or multiple layers. For example, the third conductive layer 130 may be formed or disposed to have a stacked structure of Ti/Al/Ti, Mo/Al/Mo, Mo/AlGe/Mo, and Ti/Cu.

The passivation film 104 may be disposed on the third conductive layer 130. The passivation film 104 serves to cover or overlap and protect the third conductive layer 130. The passivation film 104 may include an inorganic insulating material such as silicon oxide, silicon nitride, silicon oxynitride, hafnium oxide, aluminum oxide, titanium oxide, tantalum oxide, or zinc oxide.

The fourth conductive layer 140 may be disposed on the passivation film 104. The fourth conductive layer 140 may include a first pad 141, a second pad 142, and a third pad 143. The first pad 141, the second pad 142, and the third pad 143 may be located or disposed between the first to third data lines 131, 132, and 133 and the first power supply line 134.

The first to third pads 141, 142, and 143 may overlap the first to third data conductive patterns 137, 138, and 139, respectively, and may overlap the first to third pixel electrodes PXE1, PXE2, and PXE3, respectively. In the overlapping area, each of the first to third pads 141, 142, and 143 may be electrically connected to the first to third data conductive patterns 137, 138, and 139 through the contact holes CNT27, CNT28, and CNT29 penetrating the passivation film 104 to expose the first to third data conductive patterns 137, 138, and 139, and may be electrically connected to the first to third pixel electrodes PXE1, PXE2, and PXE3 through the contact holes CNT30, CNT31, and CNT32 penetrating the via layer 105 to expose the first to third pads 141, 142, and 143. In other words, the first to third data conductive patterns 137, 138, and 139 may be electrically connected to the first to third pixel electrodes PXE1, PXE2, and PXE3 through the first to third pads 141, 142, and 143, respectively. Accordingly, the contact resistance between the first to third pads 141, 142, and 143 and the first to third pixel electrodes PXE1, PXE2, and PXE3 may be reduced.

The via layer 105 is disposed on the fourth conductive layer 140. The via layer 105 may completely cover or overlap the upper surface of the passivation film 104 on which the fourth conductive layer 140 is disposed. In a case that the via layer 105 may be formed as an organic film, its upper surface may be flat despite a lower step. The via layer 105 may include an inorganic insulating material or an organic material such as acrylic resin, epoxy resin, phenolic resin, polyamide resins, polyimide rein, unsaturated polyester resins, poly phenylene ether resin, polyphenylene sulfide resin, or benzocyclobutene (BCB).

The pixel electrode PXE may be disposed on the via layer 105. The pixel electrode PXE may include a first pixel electrode PXE1, a second pixel electrode PXE2, and a third pixel electrode PXE3. The first pixel electrode PXE1 may include an anode electrode of the light emitting element EMD of the first sub-pixel PX1, the second pixel electrode PXE2 includes an anode electrode of the light emitting element EMD of the second sub-pixel PX2, and the third pixel electrode PXE3 may include an anode electrode of the light emitting element EMD of the third sub-pixel PX3.

The first pixel electrode PXE1 may be disposed at the left side of the pixel PX with respect to the center of the pixel PX. The first pixel electrode PXE1 may be disposed to overlap the first power supply line 134, reference voltage line 135, and second power supply line 136 of the third conductive layer 130. A part of the first pixel electrode PXE1 may extend in the first direction DR1 to overlap the first pad 141.

The second pixel electrode PXE2 may be disposed around the center of the pixel PX. The second pixel electrode PXE2 may be disposed to overlap the first to third data conductive patterns 137, 138, and 139. The third pixel electrode PXE3 may be disposed adjacent to the right side of the pixel PX with respect to the center of the pixel PX. The first pixel electrode PXE1 may be disposed at a position overlapping the first to third data lines 131, 132, and 133.

The pixel defining layer PDL may be disposed on the pixel electrode PXE. Openings OPH may generally include first to third openings OPH1, OPH2, and OPH3 defined by the pixel defining layer PDL may be provided. The first to third openings OPH1, OPH2, and OPH3 may be disposed to overlap the first to third pixel electrodes PXE1, PXE2, and PXE3, respectively, to expose parts of the first to third pixel electrodes PXE1, PXE2, and PXE3.

Although not shown in the drawing, a light emitting layer (refer to 'EML' in FIG. 2) is disposed on the pixel definition layer PDL and the pixel electrodes PXE1, PXE2, and PXE3 exposed by the pixel definition layer PDL. A common electrode (or a cathode electrode, refer to "CME" in FIG. 2) may be disposed on the light emitting layer (refer to "EML" in FIG. 2). Since descriptions thereof have already been described, a redundant description will be omitted.

Hereinafter, the etch-prevention pattern EST will be described in more detail with reference to FIG. 8.

Figure 8:
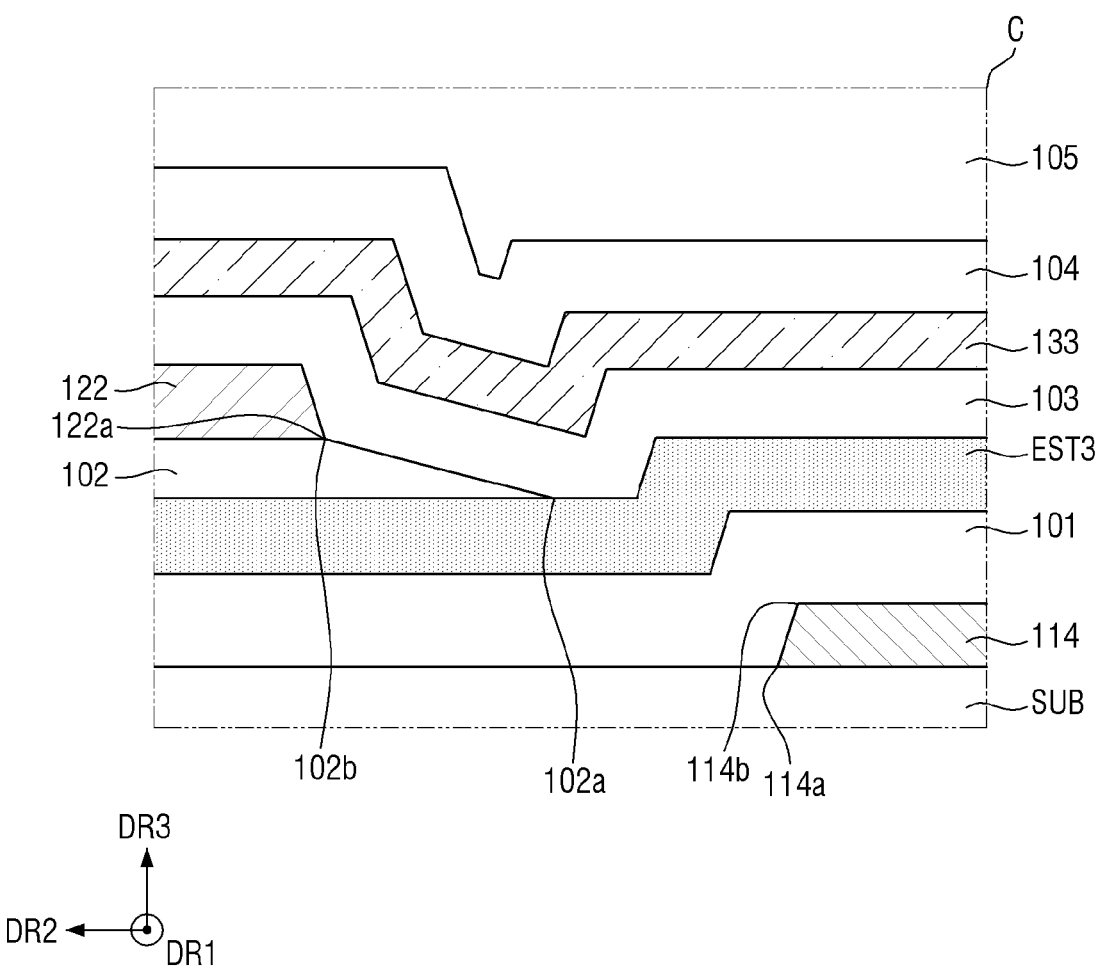
FIG. 8 is an enlarged view of the area C of FIG. 7.

FIG. 8 is an enlarged view of the area C of FIG. 7. Hereinafter, a relationship between components will be described based on the third etch prevention pattern EST3, and the first power supply line 114, sensing line 122, and third data line 133 of the first conductive layer 110. However, in the following descriptions, the content described as the third etch prevention pattern EST3 may be applied to the first etch prevention pattern EST1 or the second etch prevention pattern EST2, the content described as the sensing line 122 may be applied to the scan line 121, and the content described as the third data line 133 may also be applied to the first data line 131 or the second data line 132.

Referring to FIG. 8, the side surface of the gate insulating film 102 may be disposed outward from the side surface of the sensing line 122. The gate insulating film 102 may include a portion protruding from the sensing line 122 in the second direction DR2. For example, the side surface of the gate insulating film 102 may protrude from the side surface of the sensing line 122.

The second edge 102b of the gate insulating film 102 where the upper surface of the gate insulating film 101 meets the side surface of the gate insulating film 102 may be in direct contact with the first edge 122a of the sensing line 122 where the lower surface of the sensing line 122 meets the side surface of the sensing line 122. The first edge 102a of the gate insulating film 102 where the upper surface of the gate insulating film 101 meets the side surface of the gate insulating film 102 may be disposed outside the sensing line 122 from the first edge 122a of the sensing line 122 and the second edge 102b of the gate insulating film 102. For example, the first edge 102a of the gate insulating film 102 may protrude from the first edge 122a of the sensing line 122 and the second edge 102b of the gate insulating film 102.

The third etch-prevention pattern EST3 may cover or overlap an area between the first edge 122a of the sensing line 122 and the second edge 114b of the first power supply line 114 of the first conductive layer 110 facing the first edge 122a of the sensing line 122. In other words, the first power supply line 114 of the first conductive layer 110 may include a first edge 114a where the lower surface thereof meets the side surface thereof and a second edge 114b where the upper surface thereof meets the side surface thereof.

The second edge 114b of the first power supply line 114 of the first conductive layer 110 and the first edge 122a of the sensing line 122 face each other, and at least a part of the third etch-prevention pattern EST3 may be disposed in the area where the second edge 114b of the first power supply line 114 faces the first edge 122a of the sensing line 122.

In other words, in a plan view, the second edge 114b of the first power supply line 114 of the first conductive layer 110 and the first edge 122a of the sensing line 122 may face each other in the second direction DR2. In a schematic cross-sectional view, the second edge 114b of the first power supply line 114 of the first conductive layer 110 may be formed or disposed to face upward in the third direction DR3 while facing the sensing line 122 in the second direction DR2. In a schematic cross-sectional view, the first edge 122a of the sensing line 122 may be formed or disposed to face downward in the third direction DR3 while facing the first power supply line 114 of the first conductive layer 110 in the second direction DR2. Accordingly, in a schematic cross-sectional view, even in a case that the first power supply line 114 of the first conductive layer 110 and the sensing line 122 are disposed on different layers, the second edge 114b of the first power supply line 114 of the first conductive layer 110 and the first edge 122a of the sensing line 122 may face each other.

In a plan view, the third etch prevention pattern EST3 may be disposed between the first power supply line 114 of the first conductive layer 110 and the sensing line 122 in the second direction DR2. The third etch-prevention pattern EST3 may be disposed between the second edge 114b of the first power supply line 114 of the first conductive layer 110 and the first edge 122a of the sensing line 122 in the second direction DR2 and the third direction DR3 when viewed in a schematic cross-sectional view. For example, the third etch-prevention pattern EST3 may be disposed in a facing area between the second edge 114b of the first power supply line 114 of the first conductive layer 110 and the first edge 122a of the sensing line 122, and may cover or overlap the facing area. The facing area may be located or disposed between the second edge 114b of the first power supply line 114 of the first conductive layer 110 and the first edge 122a of the sensing line 122 not only in the second direction DR2 in a plan view but also in the second direction DR2 and the third direction DR3 in a schematic cross-sectional view.

The third etch prevention pattern EST3 may be disposed in an area overlapping the third data line 133 and in an area around the first edge 102a of the gate insulating film 102 around the overlapping area. The third etch-prevention pattern EST3 may directly contact the first edge 102a of the gate insulating film 102 in the area between the first power supply line 114 of the first conductive layer 110 and the sensing line 122. In the area between the first power supply line 114 of the first conductive layer 110 and the sensing line 122, the third etch-prevention pattern EST3 may directly contact the lower end of the side surface of the gate insulating film 101 in the second direction DR2 while directly contacting one end and/or the other end of the lower surface of the gate insulating film 102 in the second direction DR2.

The third etch-prevention pattern EST3 may extend in one or a side and the other or another side in the second direction DR2 while being disposed to overlap the first edge 102a of the gate insulating film 101. The third etch prevention pattern EST3 may overlap at least a part of the gate insulating film 102 in the thickness direction (third direction DR3). However, the disclosure is not limited thereto, and for example, the third etch-prevention pattern EST3 may overlap the side surface and/or upper surface of the gate insulating film 102 in the thickness direction (third direction DR3).

The third etch-prevention pattern EST3 may extend to one or a side in the second direction DR2 to overlap the second edge 102b of the gate insulating film 102 and the first edge 122a of the sensing line 122. In this case, the third etch-prevention pattern EST3 may overlap at least a part of the sensing line 122 in the thickness direction (third direction DR3). The third etch-prevention pattern EST3 may extend to the other or another side in the second direction DR2 to overlap the first power supply line 114 of the first conductive layer 110. Moreover, the third etch-prevention pattern EST3 may extend to the other or another side in the second direction DR2 to be disposed between the first power supply line 114 of the first conductive layer 110 and the scan line 121 and overlap the scan line 121.

The third etch-prevention pattern EST3 extends to one or a side in the second direction DR2, so that the width of the third etch-prevention pattern EST3 in the second direction DR2 may be greater than the width of the sensing line 122 in the second direction DR2. In this case, the third etch-prevention pattern EST3 may overlap not only the first edge 102a of the gate insulating film 102 located or disposed between the first power supply line of the first conductive layer 110 and the sensing line 122 but also the first edge 102a of the gate insulating film 102 located or disposed in a direction opposite to the second direction DR2. For example, in a schematic cross-sectional view, the third etch-prevention pattern EST3 may overlap both the first edge 102a of the gate insulating film 102 located or disposed at one or a side in the second direction DR2 and the first edge 102a of the gate insulating film 102 located or disposed at the other or another side in the second direction DR2.

The width of the third etch-prevention pattern EST3 in the second direction DR2 may be greater than each of the width of the scan line 121 in the second direction DR2 and the width of the first power supply line 114 of the first conductive layer 110 in the second direction (DR2, but the disclosure is not limited thereto. In the area where the third etch-prevention pattern EST3 is disposed, the width of the third etch-prevention pattern EST3 in the first direction DR1 may be greater than the width of the third data line 133 in the first direction DR1, but the disclosure is not limited thereto.

The thickness TH1 of the buffer layer 101 in an area not overlapping the third etch-prevention pattern EST3 in the thickness direction (third direction DR3) may be smaller than the thickness TH2 of the buffer layer 101 in an area overlapping the third etch-prevention pattern EST3 in the thickness direction (third direction DR3).

Although it is shown in the drawings that the gate insulating film 102 does not overlap the first power supply line 114 of the first conductive layer 110 in the thickness direction (third direction DR3), the disclosure is not limited thereto, and the gate insulating film 102 may overlap at least a part of the first power supply line 114 of the first conductive layer 110 in the thickness direction (third direction DR3).

As the etch-prevention pattern EST is disposed, the over-etch of the buffer layer 101 around the gate insulating film 101 may be suppressed and prevented. For explaining this result, reference made to FIG. 9.

Figure 9:
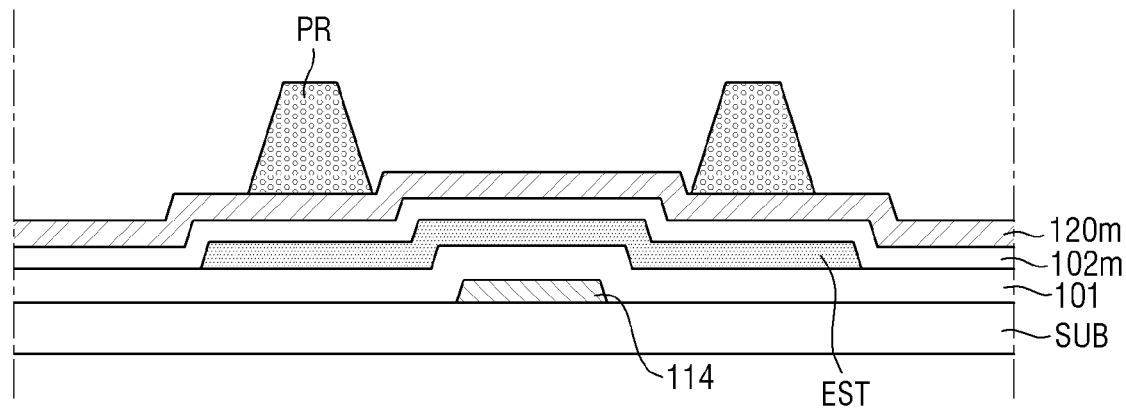
FIG. 9 is a view illustrating a process of forming a second conductive layer and a gate insulating film according to an embodiment.
Figure 9:
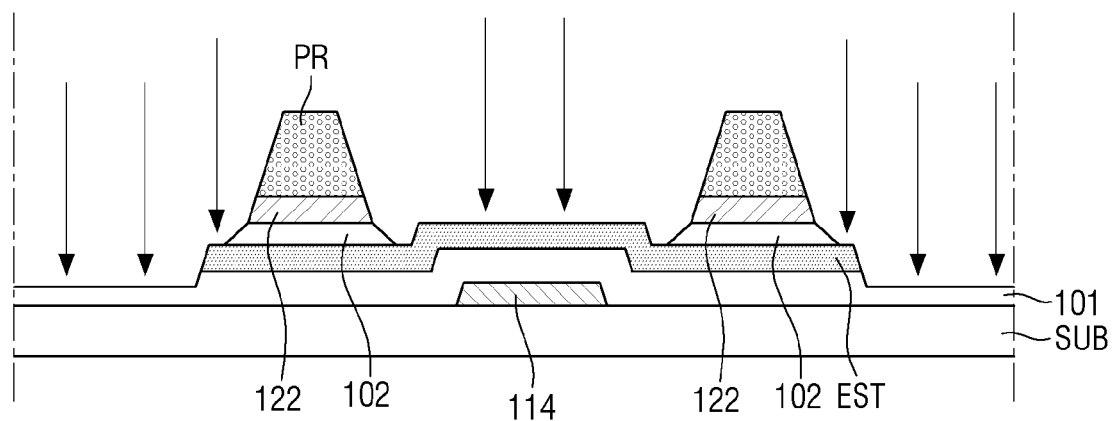
Figure 9:
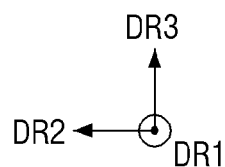

FIG. 9 is a view illustrating a process of forming a second conductive layer from material layer 120m and a gate insulating film from another material layer 102m according to an embodiment.

Referring to FIG. 9, a patterned gate insulating film 102 and a patterned second conductive layer 120 may be formed by one mask process. A material layer 102m for a gate insulating film is deposited on the entire surface of a buffer layer 101 on which a semiconductor layer SC may be formed or disposed, and a material layer 120m for a second conductive layer may be sequentially deposited on the entire surface of the entirely deposited material layer 102m for the gate insulating film. Subsequently, a photoresist layer is applied onto the material layer 120m for the second conductive layer, and exposed and developed to form a photoresist pattern PR exposing a part of the material layer 120m for the second conductive layer, and then the material layer 102m for the gate insulating film and the material layer 120m for the second conductive layer are sequentially etched using the photoresist pattern PR as an etching mask to pattern a gate insulating film 102 and a second conductive layer 120. Then, the photoresist pattern PR is removed through a stripping process or an ashing process.

In the process of etching the material layer 102m for the gate insulating film and the material layer 120m for the second conductive layer, the upper portion of the buffer layer 101 may be partially etched in an area not overlapping the etch-prevention pattern EST. The etch-stopper EST acts as an etch-stopper in an area overlapping the etch-prevention pattern EST, so that the buffer layer 101 may not be etched in the overlapping area. In other words, the buffer layer 101 around the gate insulating film 102 may be prevented from being over-etched in an area between the scan line 121 and the first power supply line 114 of the first conductive layer 110 and between the sensing line 122 and the first power supply line 114 of the first conductive layer 110.

As the buffer layer 101 may be prevented from being over-etched in the area, it is possible to prevent a step in the third direction DR3 from increasing in the area. Even in a case that the distances among the first power supply line 114 of the first conductive layer 110 adjacent to the scan line 121 and the sensing line 122, the buffer layer 101 disposed on the first power supply line 114, the scan line 121, and the sensing line 122 are closer, among these components, the interlayer insulating film 103 may be easily formed or disposed on the buffer layer 101 to cover or overlap the gate insulating film 102, the scan line 121, and the sensing line 122. Accordingly, the disconnection of the third conductive layer 130 disposed on the interlayer insulating film 103, by way of example, the third data line 133 extending in the second direction DR2 and disposed on the gate insulating film, the scan line 121, and the sensing line 122, or the first data line 131 or second data line 132 may be prevented. Moreover, it may be possible to prevent the occurrence of short between the first to third data lines 131, 132, and 133 adjacent to each other or prevent the occurrence of a short between the third data lines 131, 132, and 133 and the second conductive layer 120.

Hereinafter, other embodiments will be described. In the following embodiments, duplicate descriptions are omitted or simplified for the same components as those previously described, and differences are mainly described.

Figure 10:
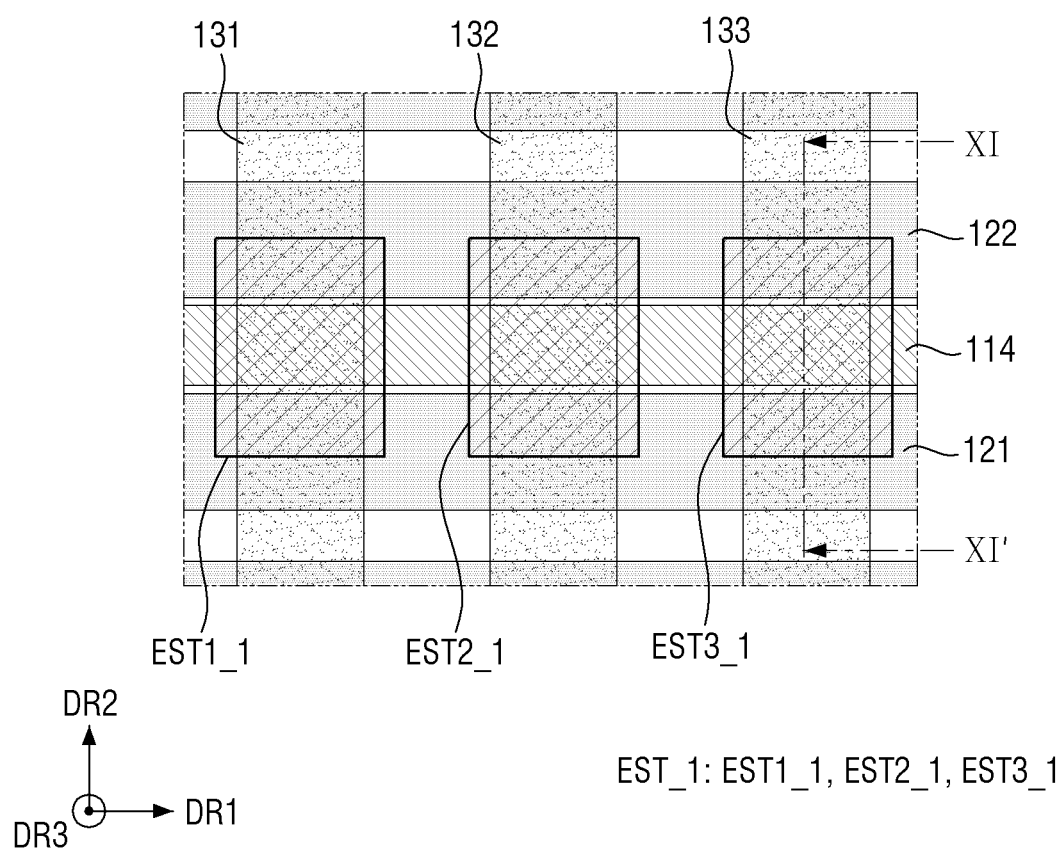
FIG. 10 is an enlarged view of an area around an etch-prevention pattern according to an embodiment.
Figure 11:
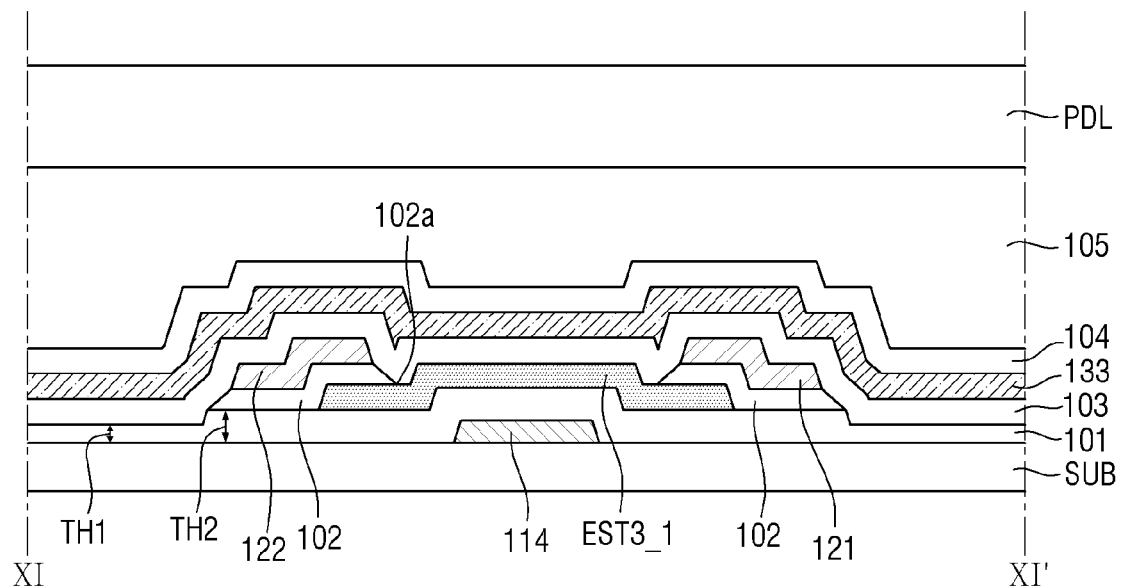
FIG. 11 is a schematic cross-sectional view taken along the line XI-XI' of FIG. 10.
Figure 11:
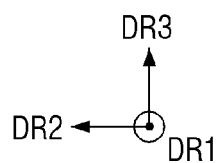

FIG. 10 is an enlarged view of an area around an etch-prevention pattern according to an embodiment, and FIG. 11 is a schematic cross-sectional view taken along the line XI-XI' of FIG. 10.

Referring to FIGS. 10 and 11, an etch-prevention pattern EST_1 according to an embodiment may be different from an embodiment of FIG. 7 in that in a schematic cross-sectional view, the etch-prevention pattern EST_1 may overlap a part of the first edge 102a of the gate insulating film located or disposed at one or a side and the other or another side in the second direction DR2.

As an example, the etch-prevention pattern EST_1 according to an embodiment may include a first etch-prevention pattern EST_1, a second etch-prevention pattern EST2_1 and a third etch-prevention pattern EST3_1. Hereinafter, the third etching prevention pattern (EST3_1) will be mainly described, but a description of the third etch prevention pattern EST3_1 may also be applied to the first etch prevention pattern EST_1 and the second etch prevention pattern EST2_1.

The third etch prevention pattern EST3_1 may overlap at least a part of the scan line 121, at least a part of the sensing line 122, and at least a part of the first power supply line 114 of the first conductive layer 110. The third etch-prevention pattern EST3_1 overlaps the first edge 102a of the gate insulating film 102 in an area between the scan line 121 and the first power supply line 114 of the first conductive layer 110 and an area between the sensing line 122 and the first power supply line 114 of the first conductive layer 110, but may not overlap the first edge 102a of the gate insulating film 102 located or disposed outside the areas therebetween. In other words, the third etch-prevention pattern EST3 may overlap the scan line 121 and the sensing line 122 and may be disposed between the scan line 121 and the sensing line 122 adjacent to each other, but may not protrude outward from the scan line 121 and the sensing line 122 adjacent to each other in the second direction DR2.

In a schematic cross-sectional view, the third etch-prevention pattern EST3 extends in the second direction DR2 while overlapping a part of the gate insulating film 102 and a part of the sensing line 122, and may thus overlap a part of the first power supply line 114 of the first conductive layer 110 and a part of the scan line 121. The width of the third etch-prevention pattern EST3 in the second direction DR2 may be greater than the width of the first power supply line 114 of the first conductive layer 110 in the second direction DR2, but the disclosure is not limited thereto.

Even in this case, the buffer layer 101 around the gate insulating film 102 may be prevented from being over-etched in an area between the scan line 121 and the first power supply line 114 of the first conductive layer 110 and an area between the sensing line 122 and the first power supply line 114 of the first conductive layer 110. Accordingly, it may be possible to prevent the disconnection of the first to third data lines 131, 132, and 133 prevent the occurrence of short between the first to third data lines 131, 132, and 133, and prevent the occurrence of short with the underlying second conductive layer 120.

Figure 12:
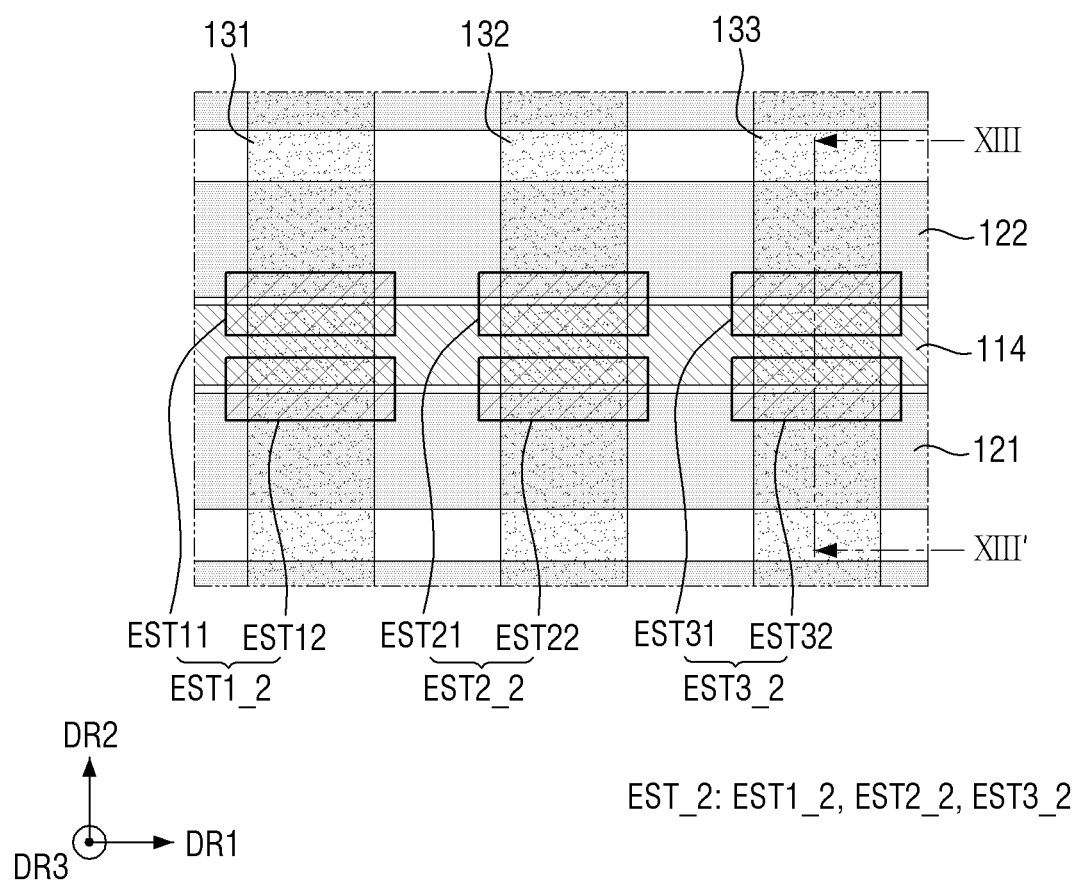
FIG. 12 is an enlarged view of an area around an etch-prevention pattern according to an embodiment.
Figure 13:
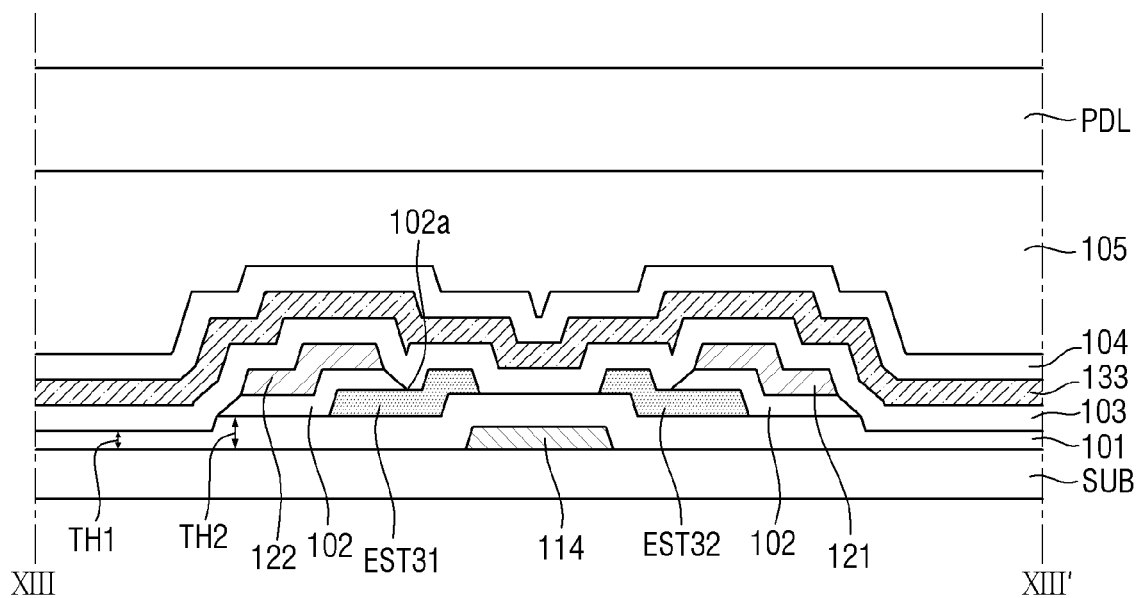
FIG. 13 is a schematic cross-sectional view taken along the line XIII-XIII' of FIG. 12.

FIG. 12 is an enlarged view of an area around an etch-prevention pattern according to an embodiment, and FIG. 13 is a schematic cross-sectional view taken along the line XIII-XIII' of FIG. 12.

Referring to FIGS. 12 and 13, an etch-prevention pattern EST_2 according to an embodiment may be different from embodiment of FIG. 7 in that the etch-prevention pattern EST_2 may include a first etch-prevention pattern EST_2, a second etch-prevention pattern EST2_2, and a third etch-prevention pattern EST3_2, and the first to third etch prevention patterns (EST1_2, EST2_2, EST3_2) may include first pattern portions (EST11, EST21, EST31, or first dummy portion) and second pattern portion (EST12, EST22, EST32, or second dummy portion), which are separated from each other.

As an example, the etch-prevention pattern EST_2 may include a first etch-prevention pattern EST1_2, a second etch-prevention pattern EST2_2, and a third etch-prevention pattern EST3_2, which are separated from each other. The first etch-prevention pattern EST1_2 may include a first pattern portion (EST11 or a first dummy portion) and a second pattern portion (EST12 or a second dummy portion) which are separated from each other, the second etch-prevention pattern EST2_2 may include a first pattern portion (EST21 or first pile portion) and a second pattern portion (EST22 or second dummy portion) which are separated from each other, and the third etch-prevention pattern EST3_2 may include a first pattern portion (EST31 or first dummy part) and a second pattern portion (EST32 or second dummy part) which are separated from each other.

The first pattern portions EST11, EST21, and EST31 may overlap the sensing line 122 and overlap the first power supply line 114 of the first conductive layer 110. The second pattern portions EST12, EST22, and EST32 may overlap the scan line 121 and overlap the first power supply line 114 of the first conductive layer 110. The first pattern portions EST11, EST21, EST31 and the second pattern portions EST12, EST22, and EST32 may be separated from each other on the first power supply line 114 of the first conductive layer 110, but the disclosure is not limited thereto. The width of each of the first pattern portions EST11, EST21, and EST31 in the second direction DR2 may be equal to the width of each of the second pattern portions EST12, EST22, and EST32 in the second direction DR2.

The width of each of the first patterns EST11, EST21, and EST31 in the second direction DR2 may be smaller than the width of the second direction DR2 of the sensing line 122, or may be smaller than the width of the first power supply line 114 of the first conductive layer 110 in the second direction DR2. The width of each of the second pattern portions EST12, EST22, and EST32 in the second patterns DR2 is smaller than the width of the scan line 121 in the second patterns DR2, or may be smaller than the width of the first power supply line 114 of the first conductive layer 110 in the second direction DR2. However, the disclosure is not limited thereto.

Even in this case, the buffer layer 101 around the gate insulating film 102 may be prevented from being over-etched in an area between the scan line 121 and the first power supply line 114 of the first conductive layer 110 and an area between the sensing line 122 and the first power supply line 114 of the first conductive layer 110. Accordingly, it may be possible to prevent the disconnection of the first to third data lines 131, 132, and 133 and to prevent the occurrence of a short between the first to third data lines 131, 132, and 133, and prevent the occurrence of a short with the underlying second conductive layer 120.

Figure 14:
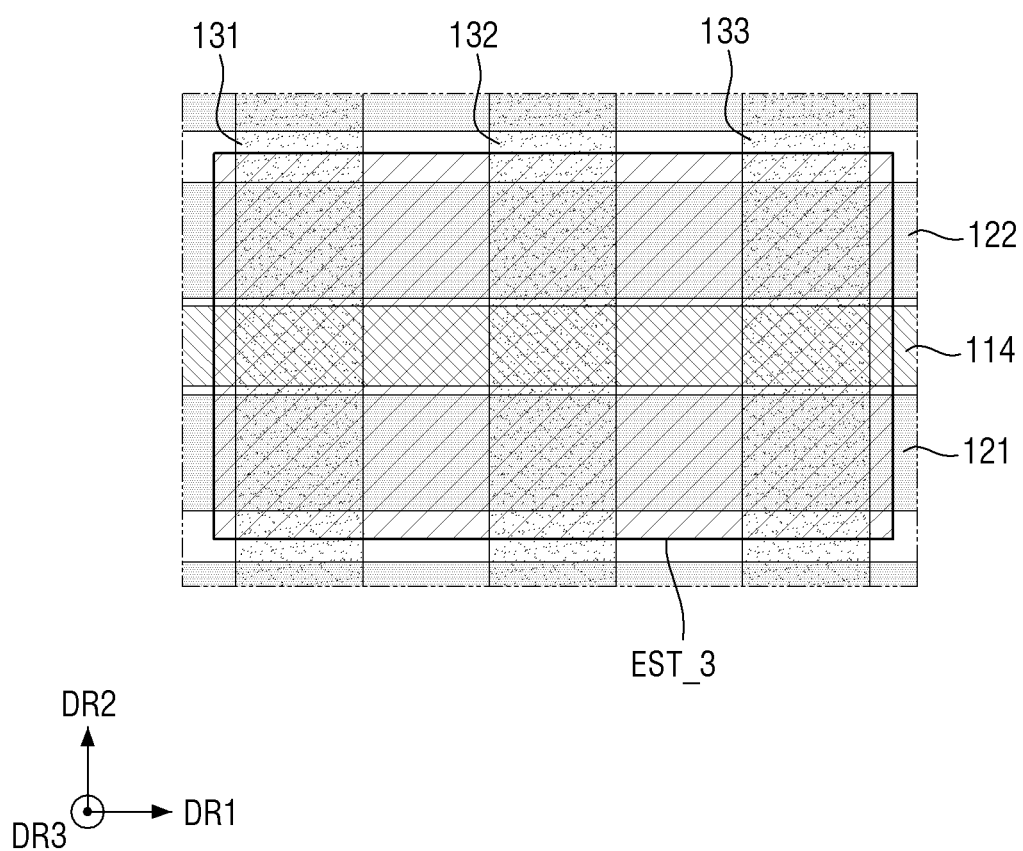
FIG. 14 is an enlarged view of an area around an etch-prevention pattern according to an embodiment.

FIG. 14 is an enlarged view of an area around an etch-prevention pattern according to an embodiment.

Referring to FIG. 14, an etch-prevention pattern EST_3 according to an embodiment may be different from an embodiment of FIG. 7 in that the etch-prevention pattern EST_3 may not be separated into first to third etch-prevention patterns.

As an example, the etch-prevention pattern EST_3 according to an embodiment may be formed as a single dummy pattern without being separated into first to third etch-prevention patterns, and may be disposed over the first to third data lines 131, 132, and 133. In other words, even in a case that the etch-prevention pattern EST_3 is not separated into the first to third data lines 131, 132, and 133, the etch-prevention pattern EST_3 may overlap the first to third data lines 131, 132, and 133 in the thickness direction (third direction DR3).

Even in this case, the buffer layer 101 around the gate insulating film 102 may be prevented from being over-etched in an area between the scan line 121 and the first power supply line 114 of the first conductive layer 110 and an area between the sensing line 122 and the first power supply line 114 of the first conductive layer 110. Accordingly, it may be possible to prevent the disconnection of the first to third data lines 131, 132, and 133, prevent the occurrence of a short between the first to third data lines 131, 132, and 133, and prevent the occurrence of a short with the underlying second conductive layer 120.

Figure 15:
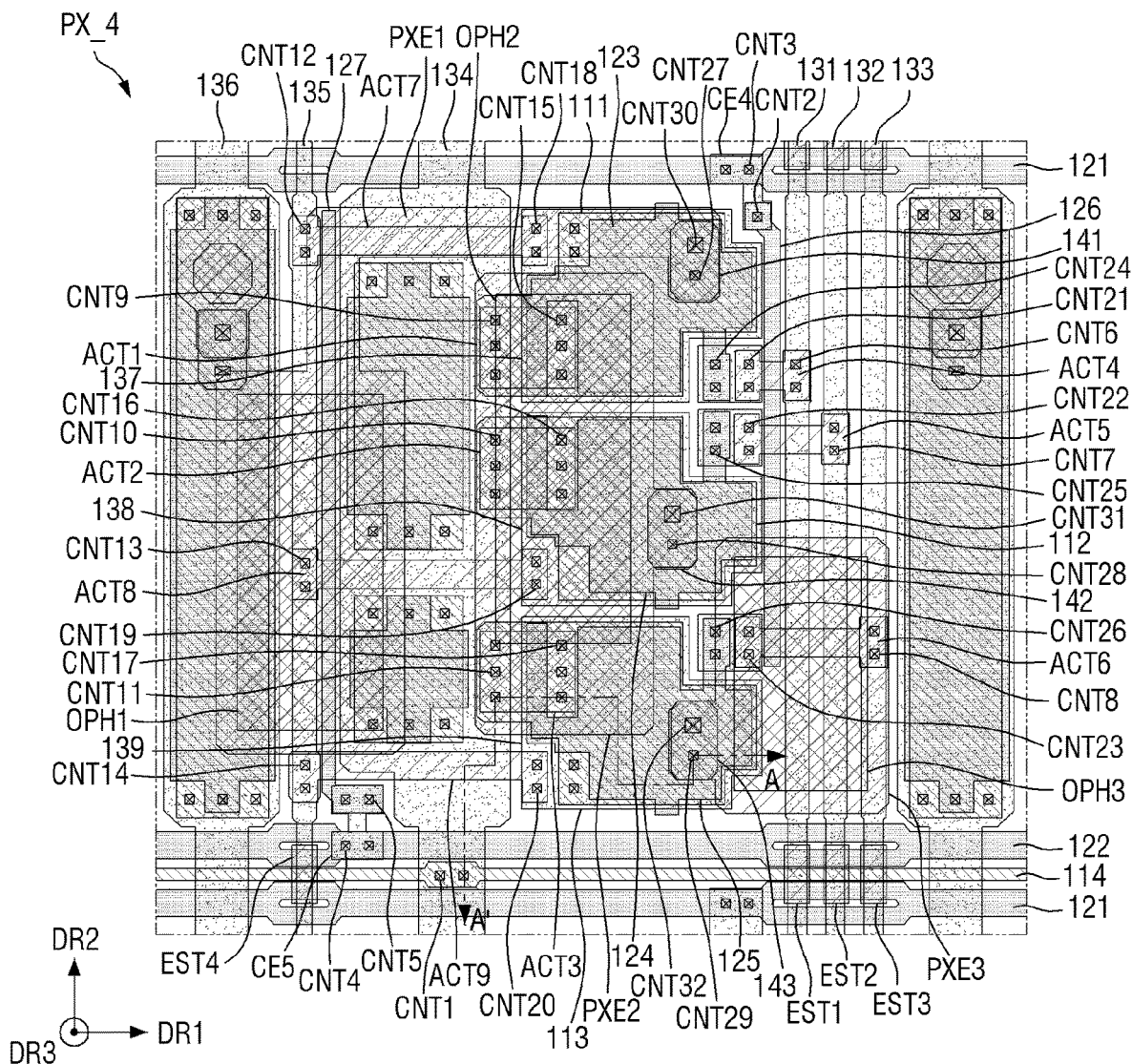
FIG. 15 is a layout view of one pixel of a display device according to an embodiment.
Figure 16:
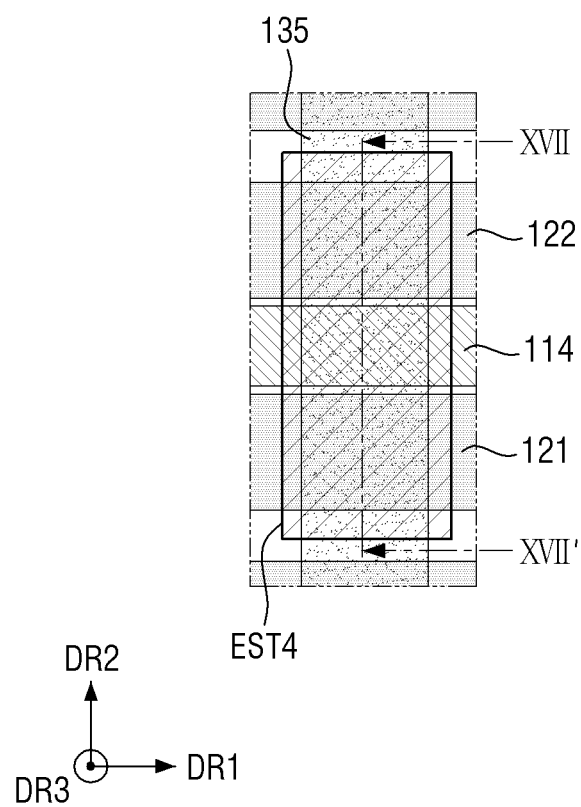
FIG. 16 is an enlarged view of an area around a fourth etch-prevention pattern according to an embodiment.
Figure 17:
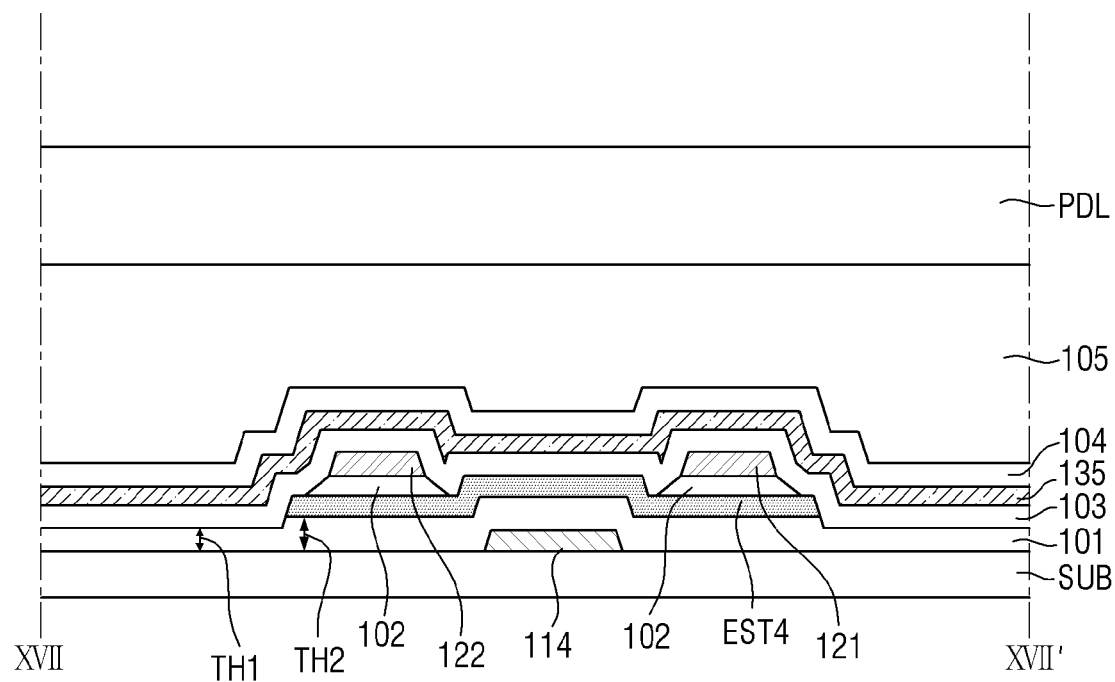
FIG. 17 is a schematic cross-sectional view taken along the line XVII-XVII' of FIG. 16.
Figure 17:
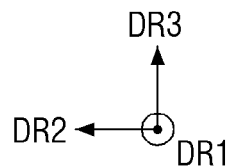

FIG. 15 is a layout view of one pixel of a display device according to an embodiment, FIG. 16 is an enlarged view of an area around an etch-prevention pattern according to an embodiment, and FIG. 17 is a schematic cross-sectional view taken along the line XVII-XVII' of FIG. 16.

Referring to FIGS. 15 to 17, an etch-prevention pattern EST_4 of one pixel PX_4 according to an embodiment may be different from an embodiment of FIG. 5 in that the etch-prevention pattern EST_4 may include a fourth etch-prevention pattern EST4.

As an example, the etch-prevention pattern EST_4 according to an embodiment may include a fourth etch-prevention pattern EST4 in addition to the first to third etch-prevention patterns EST1, EST2, and EST3. The fourth etch-prevention pattern EST4 may be disposed in an area where the scan line 121 and sensing line 122 extending in the first direction DR1 intersect the reference voltage line 135 extending in the second direction DR2. In other words, the fourth etch-prevention pattern EST4 may be disposed between the first power supply line 114 of the first conductive layer 110 and the scan line 121 of the second conductive layer 120, and/or between the first power supply line 114 of the first conductive layer 110 and the sensing line 122 of the second conductive layer 120. The fourth etch prevention pattern EST4 may be disposed to overlap the reference voltage line 135 in the area therebetween.

The fourth etch prevention pattern EST4 may cover or overlap a facing area between the edge of the first power supply line 114 of the first conductive layer 110, the edge of the scan line 121, and/or the edge of the sensing line 122, which face each other. The arrangement relationship between the fourth etch-prevention pattern EST4 and the components other than the reference voltage line 135 may be substantially the same as the aforementioned arrangement relationship between the third etch-prevention pattern EST3 and the components other than the reference voltage line 135. Therefore, a detailed description thereof will be omitted.

In this case, the buffer layer 101 around the gate insulating film 102 may be prevented from being over-etched in an area between the scan line 121 and the first power supply line 114 of the first conductive layer 110 and an area between the sensing line 122 and the first power supply line 114 of the first conductive layer 110. Accordingly, it may be possible to prevent the disconnection of the first to third data lines 131, 132, and 133, prevent the occurrence of a short between the first to third data lines 131, 132, and 133, and prevent the occurrence of a short with the underlying second conductive layer 120. Moreover, the disconnection of the reference voltage line 135 may be prevented.

According to embodiments, there may be provided a display device capable of suppressing or preventing disconnection of a signal line and suppressing or preventing a short between adjacent signal lines.

The effects of the disclosure are not limited by the foregoing, and other various effects are included herein.

Although embodiments have been disclosed for illustrative purposes, those skilled in the art will appreciate that various modifications, additions and substitutions are possible, without departing from the scope and spirit of the disclosure as disclosed in the accompanying claims.

What is claimed is:

1. A display device, comprising:
a first conductive pattern disposed on a substrate;
a first insulating layer disposed on the first conductive pattern;
a semiconductor pattern disposed on the first insulating layer;
a second insulating layer disposed on the first insulating layer and the semiconductor pattern; and
a second conductive pattern disposed on the second insulating layer, wherein
a first edge of the first conductive pattern faces a second edge of the second conductive pattern,
the first conductive pattern does not overlap the second conductive pattern in an area where the first edge of the first conductive pattern faces the second edge of the second conductive pattern,
the semiconductor pattern is disposed in the area where the first edge of the first conductive pattern faces the second edge of the second conductive pattern,
the second conductive pattern overlaps the second insulating layer, and
the second insulating layer includes a third edge protruding from the second edge of the second conductive pattern.

2. The display device of claim 1, wherein the semiconductor pattern is a dummy semiconductor pattern insulated from a signal line or an electrode.

3. The display device of claim 2, wherein the semiconductor pattern includes an oxide semiconductor.

4. The display device of claim 1, wherein the semiconductor pattern overlaps the third edge of the second insulating layer in a thickness direction.

5. The display device of claim 4, wherein
the second conductive pattern extends in a first direction, and
a width of the semiconductor pattern in a second direction intersecting the first direction is smaller than a width of the second conductive pattern in the second direction.

6. The display device of claim 4, wherein the semiconductor pattern overlaps the first edge of the first conductive pattern and the second edge of the second conductive pattern in the thickness direction, and overlaps the first conductive pattern and the second conductive pattern.

7. The display device of claim 1, further comprising:
a third insulating layer disposed on the second conductive pattern; and
a third conductive pattern disposed on the third insulating layer,
wherein the semiconductor pattern overlaps the third conductive pattern.

8. The display device of claim 7, wherein
the third conductive pattern extends in a first direction, and
a width of the third conductive pattern in a second direction intersecting the first direction is smaller than a width of the semiconductor pattern in the second direction.

9. The display device of claim 8, wherein
the first conductive pattern and the second conductive pattern extend in the second direction,
a first power supply voltage is applied to the first conductive pattern,
the second conductive pattern transmits at least one of a scan signal and a sensing signal, and
the third conductive pattern transmits a data signal.

10. The display device of claim 1, wherein a thickness of the first insulating layer in an area where the first insulating layer does not overlap the semiconductor pattern is smaller than a thickness of the first insulating layer in an area where the first insulating layer overlaps the semiconductor pattern.

11. A display device comprising:
a first conductive layer disposed on a substrate and including:
a lower light blocking pattern overlapping an active layer of a transistor; and
a first conductive pattern separated from the lower light blocking pattern;

a first insulating layer disposed on the first conductive layer;

a semiconductor layer disposed on the first insulating layer and including the active layer and a semiconductor pattern insulated from the active layer;

a second insulating layer disposed on the semiconductor layer; and a second conductive layer disposed on the second insulating layer and including:
- a gate conductive pattern overlapping the active layer; and
- a second conductive pattern disposed on the semiconductor pattern, wherein the semiconductor pattern overlaps the first conductive pattern and the second conductive pattern, the second conductive layer overlaps the second insulating layer, and the second insulating layer includes a part that overlaps the second conductive layer, and another part that protrudes from the second conductive layer.

12. The display device of claim 11, wherein the semiconductor pattern is a dummy semiconductor pattern insulated from a signal line or an electrode.

13. The display device of claim 12, wherein the semiconductor pattern includes an oxide semiconductor.

14. The display device of claim 11, wherein a thickness of the first insulating layer in an area where the first insulating layer does not overlap the semiconductor pattern is smaller than a thickness of the first insulating layer in an area where the first insulating layer overlaps the semiconductor pattern.

15. The display device of claim 11, wherein
a first edge of the first conductive pattern faces a second edge of the second conductive pattern, the first conductive pattern does not overlap the second conductive pattern in an area where the first edge of the first conductive pattern faces the second edge of the second conductive pattern, the semiconductor pattern is disposed in the area where the first edge of the first conductive pattern faces the second edge of the second conductive pattern, and the second insulating layer includes a third edge protruding from the second edge of the second conductive pattern.

16. The display device of claim 15, wherein the semiconductor pattern overlaps the third edge of the second insulating layer in a thickness direction.

17. The display device of claim 16, wherein the semiconductor pattern overlaps the first edge of the first conductive pattern and the second edge of the second conductive pattern in a thickness direction, and overlaps the first conductive pattern and the second conductive pattern.

18. The display device of claim 11, further comprising:
a third insulating layer disposed on the second conductive layer; and a third conductive pattern disposed on the third insulating layer, wherein the semiconductor pattern overlaps the third conductive pattern.

19. The display device of claim 18, wherein
the third conductive pattern extends in a first direction, and a width of the third conductive pattern in a second direction intersecting the first direction is smaller than a width of the semiconductor pattern in the second direction.

20. The display device of claim 19, wherein
the first conductive pattern and the second conductive pattern extend in the second direction, a first power supply voltage is applied to the first conductive pattern, the second conductive pattern transmits at least one of a scan signal and a sensing signal, and the third conductive pattern transmits a data signal.

* * * * *